United States Patent
Kubota

(10) Patent No.: US 7,308,045 B2
(45) Date of Patent: Dec. 11, 2007

(54) BINARIZING CIRCUIT, WIRELESS COMMUNICATION DEVICE, AND BINARIZING METHOD

(75) Inventor: Shinpei Kubota, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 819 days.

(21) Appl. No.: 10/413,134

(22) Filed: Apr. 15, 2003

(65) Prior Publication Data

US 2003/0206126 A1   Nov. 6, 2003

(30) Foreign Application Priority Data

Apr. 22, 2002   (JP) .............................. 2002-119650

(51) Int. Cl.
*H04L 25/06* (2006.01)
(52) U.S. Cl. ..................................... 375/317
(58) Field of Classification Search ................ 375/287, 375/316–319, 324, 126, 155
See application file for complete search history.

(56) References Cited

U.S. PATENT DOCUMENTS

| | | | | |
|---|---|---|---|---|
| 4,963,872 A * | 10/1990 | Schneider et al. | ........... | 341/142 |
| 5,490,127 A * | 2/1996 | Ohta et al. | ................ | 369/47.51 |
| 5,548,570 A * | 8/1996 | Hirajima et al. | ........ | 369/59.16 |
| 5,933,458 A | 8/1999 | Leurent et al. | .............. | 375/317 |
| 6,104,238 A * | 8/2000 | Mattisson et al. | .......... | 329/319 |
| 6,184,814 B1 * | 2/2001 | Mattisson | ................... | 341/155 |
| 6,498,929 B1 | 12/2002 | Tsurumi et al. | ............. | 455/296 |
| 7,076,720 B1 * | 7/2006 | Yoshida et al. | ............. | 714/755 |
| 7,184,494 B2 * | 2/2007 | Umetani | ...................... | 375/324 |

FOREIGN PATENT DOCUMENTS

| | | |
|---|---|---|
| JP | 03-143012 | 6/1991 |
| JP | 08-279829 | 10/1996 |
| JP | 10-013482 | 1/1998 |
| JP | 11-284678 | 10/1999 |

OTHER PUBLICATIONS

Office Action in JP 2002-119650, Mar. 1, 2005.

* cited by examiner

*Primary Examiner*—Don N. Vo
(74) *Attorney, Agent, or Firm*—Nixon & Vanderhye, PC

(57) ABSTRACT

An example wireless communication device is provided with a binarizing circuit which precisely carries out binarization even if a level of an input signal is kept substantially consistent for a long period. The binarizing circuit includes: a comparator which outputs a data slicer output by comparing a generated signal generated from a demodulated signal with 0 level; a feedback circuit which detects a direct current level of the generated signal, thereby outputting an inversion signal of the direct current level; and an adder circuit which outputs the generated signal by adding the inversion signal to the demodulated signal. Since an offset canceller of the feedback circuit outputs 0 to an integration circuit when the generated signal falls within a predetermined range, the generated signal does not follow the demodulated signal even if the demodulated signal is kept at a substantially consistent level, thereby reducing errors.

28 Claims, 17 Drawing Sheets

BINARIZING CIRCUIT, WIRELESS COMMUNICATION DEVICE, AND BINARIZING METHOD

FIELD OF THE INVENTION

The present invention relates to a binarizing circuit which binarizes an input signal so as to output a binarized signal, a wireless communication device, and a binarizing method, more particularly to a binarizing circuit which, for instance, binarizes a demodulated signal obtained by demodulating a received signal, a wireless communication device which is provided with the binarizing circuit and carries out wireless communication using a radio frequency, and a binarizing method for binarizing the demodulated signal.

BACKGROUND OF THE INVENTION

Wireless communication devices for receiving a radio signal have typically been arranged in such a manner that a received signal is converted to an analog demodulated signal by means of a predetermined arrangement, and this demodulated signal is binarized using a binarizing circuit so that an originally-transmitted radio signal is reconstructed.

An example of conventional binarizing circuits for binarizing a demodulated signal is described in reference to FIG. 10.

A binarizing circuit 41 includes a differentiating circuit 42 and a comparator 43.

The differentiating circuit 42 outputs a value corresponding to the slope of temporal variation of an input signal.

The comparator 43 compares the levels of respective input signals with each other, thereby outputting a signal corresponding to the result of the comparison. The comparator 43 compares the output from the differentiating circuit 42 with a signal with 0V (not illustrated), thereby outputting a value corresponding to the polarity of the output from the differentiating circuit 42.

Here, an example of signal waveforms in the binarizing circuit 41 is illustrated in reference to FIG. 11.

On the top of FIG. 11, an original binary data (original data) R on the side of the sender of a radio signal is illustrated for reference's sake.

In the middle of FIG. 11, a demodulated signal Q, which is an output signal from a demodulator 44, is illustrated. The demodulated signal Q is generated by demodulating a radio signal transmitted from a sender, the radio signal having been modulated from the foregoing binary data R.

On the bottom of FIG. 11, a data slicer output U which is an output signal from the binarizing circuit 41 is illustrated. The data slicer output U is generated by processing the demodulated signal Q in the differentiating circuit 42 and the comparator 43.

As illustrated in FIG. 10, a received signal N, which is obtained from an aerial, etc. (not illustrated), is converted to the demodulated signal Q in the demodulator 44, thereby inputted to the differentiating circuit 42. The output from this differentiating circuit 42 is supplied to the comparator 43. The comparator 43 carries out binarization according to the polarity of the signal supplied from the differentiating circuit 42, thereby outputting the data slicer output U.

As described above, it is possible to obtain the data slicer output U by binarizing the demodulated signal Q using the binarizing circuit 41.

Next, another example of the conventional binarizing circuits is described in reference to FIG. 12.

In the following description, members having the same functions as those described above are given the same numbers, so that the descriptions are omitted for the sake of convenience.

A binarizing circuit 45 is, as illustrated in FIG. 12, provided with a low-pass filter (LPF) 46 and a comparator 47.

The low-pass filter 46 removes a frequency component not less than a predetermined cutoff frequency from a supplied signal, thereby outputting only the remaining frequency component.

For instance, provided that the frequency component not less than the predetermined frequency is an alternating current component and the remaining frequency component is a direct current component, the low-pass filter 46 removes the alternating current component from the supplied signal and outputs the direct current component.

The comparator 47 compares the magnitudes of respective input signals with each other, thereby outputting a predetermined signal corresponding to the result of the comparison. The comparator 47 compares a demodulated signal Q outputted from the demodulator 44 with a slice level S outputted from the low-pass filter 46, thereby outputting a value corresponding to the result of the comparison.

Referring to FIGS. 13 and 14, an example of signal waveforms of the binarizing circuit 45 is illustrated as below.

On the top of FIG. 13, the respective temporal variations of the demodulated signal Q and the slice level S are illustrated. On the bottom of FIG. 13, the data slicer output U is illustrated.

On the top of FIG. 14, the demodulated signal Q and the slice level S are illustrated. On the bottom of FIG. 14, the data slicer output U is illustrated.

As illustrated in FIG. 12, a received signal N, which is obtained from an aerial, etc. (not illustrated), is converted to the demodulated signal Q in the demodulator 44. The demodulated signal Q is then supplied to the low-pass filter 46 and the comparator 47.

The low-pass filter 46 takes out the direct current component from the demodulated signal Q, thereby outputting the same as the slice level S.

The comparator 47 compares the demodulated signal Q with the slice level S so as to output a predetermined value in accordance with the result of the comparison, as a data slicer output U.

As described above, the binarizing circuit 45 binarizes the demodulated signal Q using the slice level S which varies in accordance with the magnitude of the demodulated signal Q so that the data slicer output U is obtained.

Next, a further example of the conventional binarizing circuits is described in reference to FIG. 15.

A binarizing circuit 48 is, as illustrated in FIG. 15, provided with a slice level detector circuit 49 and a comparator 50.

The slice level detector circuit 49 generates a slice level S according to a maximum hold value MAX and a minimum hold value MIN of a demodulated signal Q, thereby outputting the slice level S. This slice level detector circuit 49 will be specifically described later.

The comparator 50 compares the magnitudes of respective input signals with each other, thereby outputting a predetermined signal corresponding to the result of the comparison. The comparator 50 compares the demodulated signal Q with a slice level S, thereby outputting a value corresponding to the result of the comparison.

Now, the slice level detector circuit 49 is specifically described as below.

The slice level detector circuit 49 includes a maximum value detector circuit 51, a minimum value detector circuit 52, an adder circuit 53, and an amplifier 54.

The maximum value detector 51 detects the maximum value of a supplied signal and keeps the same, thereby outputting the value as a maximum hold value MAX. The minimum value detector circuit 52 detects the minimum value of the supplied signal and keeps the same, thereby outputting the value as a minimum hold value MIN. The adder circuit 53 adds up the supplied signals so as to produce an output. The amplifier 54 halves the level of the supplied signal so as to output the halved signal.

Now, an example of signal waveforms of the binarizing circuit 48 is described in reference to FIG. 16.

On the top of FIG. 16, an original binary data (original data) R on the side of the sender of a radio signal is illustrated for reference's sake.

On the middle of FIG. 16, a demodulated signal Q, which is an output signal from a demodulator 44, is illustrated. The demodulated signal Q is generated by demodulating a radio signal transmitted from the binarizing circuit 51, the radio signal having been modulated from the foregoing binary data R.

Other signals illustrated in the middle of FIG. 16 are: the maximum hold value MAX outputted from the maximum value detector circuit 51; the minimum hold value MIN outputted from the minimum value detector circuit 52; and a slice level S outputted from the slice level detector circuit 49.

On the bottom of FIG. 16, a data slicer output U which is generated from the demodulated signal Q and the slice level S in the comparator 50 is illustrated.

As in FIG. 15, a signal N, which is obtained from an aerial, etc. (not illustrated), is converted to the demodulated signal Q in the demodulator 44, thereby inputted to the slice level detector circuit 49 and the comparator 50.

In the slice level detector circuit 49, the maximum value detector circuit 51 and the minimum value detector circuit 52 output the maximum hold value MAX of the demodulated signal Q and the minimum hold value MIN of the demodulated signal Q, respectively.

The adder circuit 53 adds up the supplied maximum hold value MAX and minimum hold value MIN, so as to produce an output. The amplifier 54 halves the output of the adder circuit 53, i.e. halves the summation of the maximum hold value MAX and the minimum hold value MIN, so as to produce an output as the slice level S.

With these operations, the slice level detector circuit 49 outputs a value of (MAX+MIN)/2 as the slice level S.

The comparator 50 compares the supplied slice level S with the demodulated signal Q, and outputs a predetermined value according to the result of the comparison.

In this manner, it is possible to obtain the data slicer output U by binarizing the demodulated signal Q using the binarizing circuit 48.

As yet another example of the conventional binarizing circuits, the following will describe an arrangement taught by Japanese Laid-Open Patent Application No. 3-143012/1991 (Tokukaihei 3-143012; published on Jun. 18, 1991), in reference to FIG. 17.

A binarizing circuit 55 is, as illustrated in FIG. 17, provided with a maximum and minimum values detecting section 56, a maximum value keeping section 57, a minimum value keeping section 58, an intermediate level generation section 59, and a comparator 60.

Here, the difference between the binarizing circuit 55 and the binarizing circuit 48 is in that the maximum value keeping section 57 and the minimum value keeping section 58 are provided in the former circuit.

In the binarizing circuit 55, the comparator 60 corresponds to the comparator 50, the maximum and minimum values detecting section 56 corresponds to the maximum value detector circuit 51 and the minimum value detector circuit 52, and the intermediate level generation section 59 corresponds to the adder circuit 53 and the amplifier 54.

The maximum value keeping section 57 and the minimum value keeping section 58 figure out a maximum hold value and a minimum hold value in more precise manners, respectively. The values are figured out by setting respective time scales which are both different from that of the maximum and minimum values detecting section 56, in order to carry out the binarization more precisely.

The binarizing circuit 55 carries out the binarization through operations similar to those of the binarizing circuit 48 in FIG. 16.

As described above, it is possible to obtain the data slicer output U by binarizing the demodulated signal Q using the binarizing circuit 55.

However, in this arrangement, if the level of the demodulated signal is kept substantially consistent for a period longer than a predetermined time scale, the slice level follows this consistent level so that a detection error could occur when a noise is generated in the consistent level.

That is to say, in the arrangement in FIG. 11 which illustrates an example of the operation of the binarizing circuit 41 in FIG. 10, the following problem could occur.

In the example illustrated in FIG. 11, a noise is generated in the demodulated signal Q at a timing P1 because of a noise in the radio signal, and this causes an erroneous inversion of the data slicer output U at the timing P1.

This indicates that when a noise is detected on the occasion that the level of the demodulated signal Q is substantially consistent, an error could arise in the data slicer output U.

Further, since the temporal variation of the noise at the timing P1 has a shape causing diversion, the data slicer output U inverted at the timing P1 does not return to the value before the inversion.

Thus, until the demodulated signal is inverted again around a timing P2, errors arise in the data slicer output U at the timings P1 and P2.

In this manner, the binarizing circuit 41 using the differentiating circuit 42 could have such a problem that an error arises due to excessively sensitive response to a noise. Moreover, this could cause another problem such that the error which has been arisen is kept for a certain period of time and consequently a bit error rate (BER) deteriorates.

Further, in the binarizing circuit 45 in FIG. 12, the following problem could occur as illustrated in FIGS. 13 and 14.

As FIG. 13 illustrates, as in a portion between timings P3 and P5, the demodulated signal Q for binarization is occasionally kept at a consistent level for a predetermined period of time, according to the level of a transmitted signal (not illustrated).

The signal level S which is outputted from the low-pass filter 46 indicates a direct current level of the demodulated signal Q.

Thus, when the demodulated signal Q for binarization is kept at a consistent level for a predetermined period of time as in the portion between the timings P3 and P5, the slice level S comes close to the consistent level as indicated in a portion between the timings P4 to P5.

Here, the low-pass filter 46 is a member for outputting a frequency component not more than a cutoff frequency, as described above. For this reason, if, for instance, the demodulated signal Q is kept at a consistent level for one period of the cutoff frequency, the slice level S follows the demodulated signal Q. That is, one period of the cutoff frequency is equivalent to a time scale which causes the slice level S to follow the demodulated signal Q.

Thus, in this case the slice level S is substantially equal to the level of the demodulated signal Q as indicated in the portions between the timings P4 and P5 so that small noises in the demodulated signal Q could be detected, causing errors in the data slice output U indicated by a dotted line.

Further, as FIG. 14 illustrates, even in an arrangement opposite to the above, which, for instance, adopts a low-pass filter 46 whose cutoff frequency is lowered so that one period of the cutoff frequency is extended, the following problem could occur.

In this case, since the period necessary for causing the slice level S to follow the demodulated signal Q is extended as described above, the slice level S does not always follow the demodulated signal Q as in the portions between timings P6 and P7 in FIG. 14, and this could cause an error in the data slicer output U as in FIG. 14.

Thus, in the binarizing circuit in FIG. 12, since the low-pass filter 46 produces the time scale concerning the aforementioned following, errors due to the detection of noises are likely to occur as in FIG. 13 when the time scale is shortened, while an error on account of the slice level not following the demodulated signal is likely to occur as in FIG. 14 when the time scale is extended.

Further, when the aforementioned binarizing circuit 45 is included in a wireless communication device, a problem as below could occur. That is, the wireless communication device typically has a period in which no signal is received, such as a waiting time for a radio signal. Thus, when, for instance, a radio signal is received after a long waiting time, a slice level follows a false signal level in the waiting time, and hence errors could occur until the slice level correctly follows the level of a demodulated signal obtained from a signal received after the waiting time.

In the binarizing circuit 48 in FIG. 15, the problem as below could occur as illustrated in FIG. 16.

In the example in FIG. 16, in an original data R, a waiting time during which signals are neither transmitted nor received lasts until a timing P8. The original data R after the timing P8 corresponds to the header of a packet of outgoing data or incoming data.

As illustrated in FIG. 16, the slice level follows a demodulated signal generated by received noises, obstructive radio waves, etc during the waiting time, until the timing P8. In consequence, errors occur in the data slicer output, at the respective timings P8 and P9 which are immediately after starting to receive data.

During the waiting time until the timing P8, also the maximum hold value MAX and the minimum hold value MIN obtained in the respective circuits 51 and 52 could follow the demodulated signal Q generated by received noises and obstructive radio waves, causing the occurrence of errors.

That is to say, in the example of FIG. 16, the maximum hold value MAX is determined by a false maximum hold value during the waiting time so that an error occurs in the data slicer output U after a timing P10.

Since the operation of the binarizing circuit 55 illustrated in FIG. 17 is, as in the case of the binarizing circuit 48, also accompanied with a time scale of some kind, there is such a possibility that the slice level follows a false signal during a period for waiting the receipt of a correct signal, causing the occurrence of an error after starting the receipt.

As described above, the conventional binarizing circuits 41, 45, 48, and 55 are arranged such that, for instance, when a sequence of bits 0 is supplied as a radio signal or when a wireless communication device is in the state of waiting, the slice level follows a false signal so as to be kept at an undesired level, thereby causing the occurrence of errors.

SUMMARY OF THE INVENTION

To solve the foregoing problem, the objective of the present invention is to provide a binarizing circuit, a wireless communication device, and a binarizing method, by which binarization is precisely carried out even if the level of an input signal is kept substantially consistent for a long period of time.

To achieve the objective, the binarizing circuit in accordance with the present invention, outputting an output signal generated by binarizing an input signal which has been inputted to the binarizing circuit and oscillates around a predetermined direct current level, is characterized by comprising: a comparator which compares a generated signal generated from the input signal with a predetermined level voltage, so as to output the output signal; a feedback circuit which detects the direct current level of the generated signal, so as to output, as a feedback output, a signal which is an inversion of the direct current level; and an adder which outputs the generated signal obtained by adding the feedback output to the input signal.

According to this arrangement, to the input signal oscillating around the direct current level, the feedback output which is an inversion of the direct current level detected from the input signal is added. Therefore, the direct current level is cancelled so that the generated signal to be obtained oscillates around 0.

Here, the predetermined level voltage is equivalent to 0-level around which the generated signal oscillates Since the binarization is carried out by the comparator with reference to the level which is the center of the oscillation, it is possible to carry out the binarization properly.

Further, according to the foregoing arrangement, obtaining a proper feedback output by adopting, for instance, an arrangement below enables to precisely carry out the binarization even if the level of the input signal is kept substantially consistent for a long period of time.

Moreover, according to the foregoing arrangement, further precise binarization can be carried out by causing a signal value supplied to the comparator to be certainly within a particular range, using, for instance, an output restraint circuit below.

Thus, the present invention provides a binarizing circuit which can perform precise binarization and hence successfully demodulate a transmitted radio signal, even if the direct current level of the signal is quickly changed as in the case of adopting time-division radio signal transmission methods such as the Time Division Multiple Access (TDMA) and the Frequency Hopping of a spread spectrum method. Also in the case of wireless communication methods adopting packet switching, the present invention provides a binarizing circuit which can perform precise binarization and hence successfully demodulate a transmitted radio signal, even if an adopted method only allows small preamble for the binarization.

It is noted that, as long as predetermined functions are realized, the foregoing and below-mentioned members as means of the binarizing circuit of the present invention may be, for instance, realized as combinations of predetermined circuit elements or realized as functional blocks by programming predetermined programmable circuit elements.

To achieve the foregoing objective, the binarizing circuit is characterized by comprising: a low-pass filter which detects a predetermined direct current level around which an input signal oscillates, so as to output the detected direct current level; a comparator which outputs an output signal obtained by comparing the input signal with the direct current level; and an offset generation section which outputs an output value in accordance with a difference of levels between the input signal and the direct current level and a maximum limit value and a minimum limit value which determine a predetermined threshold range, the output value being any one of: 0 when the difference of the levels is within the threshold range; a difference between the difference of the levels and the maximum limit value, when the difference of the levels is more than the maximum limit value; and a difference between the difference of the levels and the minimum limit value, when the difference of the levels is less than the minimum limit value, the low-pass filter outputting the direct current level, which has been detected by the use of the foregoing output value, to the comparator and the offset generation section.

The binarizing circuit with this arrangement operates in the manner as below.

First, assume that the difference between the level of the input signal and the direct current level is more than the maximum limit value.

In this case, the difference between the difference of the levels and the maximum limit value is outputted from the offset generation section, as a positive output value. The direct current level is detected from this output value by the low-pass filter, and then supplied to the comparator and the offset generation section.

Since the output value is positive, the direct current level detected by the low-pass filter increases.

In the meantime, the detected direct current level is supplied to the offset generation section. Provided that the input signal is consistent, the increase of the direct current level causes the decrease of the difference of the levels.

That is to say, the difference of the levels is decreased in order to vary the output from the offset generation section to follow the variation of the input signal.

Thus, even if, for instance, the direct current level of the input signal steeply varies, the output properly follows the variation so that the binarization is carried out correctly.

The same holds true for a case when the difference between the level of the input signal and the direct current level is smaller than the minimum limit value.

That is, in this case, the difference between the difference of the levels and the minimum limit value is outputted from the offset generation section, as a negative output value. Because of this, the direct current level decreases so that the difference of the levels comes close to the minimum limit value.

Thus, as in the foregoing case, even if, for instance, the direct current level of the input signal steeply varies, the output properly follows the variation so that the binarization is carried out correctly.

In the meantime, if the difference of the aforementioned levels is within the threshold range between the maximum limit value and the minimum limit value, 0 is outputted from the offset generation section.

In this case, since the direct current level does not vary, the output does not unnecessarily follows the level of the input signal, even if the input signal is kept at a substantially consistent level for a predetermined period of time.

On this account, it is possible to obtain a stable output even when the input signal is kept at a substantially consistent level.

To achieve the foregoing objective, the wireless communication device in accordance with the present invention, comprising a binarizing circuit which outputs an output signal generated by binarizing an input signal oscillating around a predetermined direct current level, is characterized in that the binarizing circuit comprises: a comparator which compares a generated signal generated from the input signal with a predetermined level voltage, so as to output the output signal; a feedback circuit which detects the direct current level of the generated signal, so as to output, as a feedback output, a signal which is an inversion of the direct current level; and an adder which outputs the generated signal obtained by adding the feedback output to the input signal.

To achieve the foregoing objective, the wireless communication device in accordance with the present invention is characterized by comprising a binarizing circuit which includes: a low-pass filter which detects a predetermined direct current level around which an input signal oscillates, so as to output the detected direct current level; a comparator which outputs an output signal obtained by comparing the input signal with the direct current level; and an offset generation section which outputs an output value in accordance with a difference of levels between the input signal and the direct current level and a maximum limit value and a minimum limit value which determine a predetermined threshold range, the output value being any one of: 0 when the difference of the levels is within the threshold range; a difference between the difference of the levels and the maximum limit value, when the difference of the levels is more than the maximum limit value; and a difference between the difference of the levels and the minimum limit value, when the difference of the levels is less than the minimum limit value, the low-pass filter outputting the direct current level, which has been detected by the use of the input value, to the comparator and the offset generation section.

This binarizing circuit of the wireless communication device can carry out precise binarization even if the level of the input signal is kept at a substantially consistent level for a long period of time. Thus, using this binarizing circuit, the wireless communication device can realize stable wireless communication by means of precise binarization which is carried out even if the level of the input signal is kept substantially consistent for a long period of time.

To achieve the foregoing objective, the binarizing method in accordance with the present invention, for outputting an output signal generated by binarizing an input signal oscillating around a predetermined direct current level, is characterized by comprising the steps of: (a) detecting the direct current level using a generated signal generated from the input signal, then outputting, as a feedback output, a signal equivalent to an inversion of the direct current level; (b) outputting a sum of the input signal and the feedback output, as the generated signal; and (c) outputting the output signal obtained by comparing the generated signal with a predetermined level voltage.

According to this arrangement, the binarization is carried out with reference to the level which is the center of the oscillation, by operations similar to those of the foregoing binarizing circuit. Thus, the binarization is properly carried out.

Further, in the foregoing arrangement, obtaining a proper feedback output by, for instance, the following arrangement enables to carry out precise binarization even if the input signal is kept at a substantially consistent level for a long period of time.

To achieve the foregoing objective, the binarizing method in accordance with the present invention, for detecting a predetermined first direct current level around which an input signal oscillates, then outputting an output signal obtained by comparing the input signal with the first direct current level, is characterized by comprising the steps of: measuring a first difference between the first direct current level and a level of the input signal; outputting an output value in accordance with a second difference between the input signal and a second direct current level which has previously been detected and a maximum limit value and a minimum limit value which determine a predetermined threshold range, the output value being any one of: 0 when the second difference falls within the threshold range; a difference between the second difference and the maximum limit value, when the second difference is more than the maximum limit value; and a difference between the second difference and the minimum limit value, when the second difference is less than the minimum limit value; and detecting the first direct current level by use of the output value.

According to this arrangement, it is possible to achieve effects similar to those of the foregoing binarizing circuit, by operations similar to those of the above.

That is to say, when the difference between the level of the input signal and the direct current level is within the threshold range between the maximum limit value and the minimum limit value, the output value is determined to be 0 and the direct current level is detected using this output value. For this reason, even if the input signal is kept at a substantially consistent level for a predetermined period of time, it is possible to obtain a stable output without varying the direct current level.

To achieve the foregoing objective, the binarizing method in accordance with the present invention, for carrying out binarization in accordance with a difference, is characterized by comprising the steps of: (A) generating an offset by converting a difference between an input signal and a third direct current level which has been detected from a previous input signal, then outputting the offset; and (B) detecting a fourth direct current level of the input signal, from the offset.

According to this arrangement, the binarizing method is arranged such that the difference between the input signal and the third direct current level is converted and outputted as the offset, so that the fourth direct current level is detected from this offset, thereby the binarization being carried out in accordance with the difference between the input signal and the fourth direct current level. Repeating this arrangement, the input signal is binarized and then outputted.

It is noted that the step of detecting the fourth direct current level of the input signal from the offset may be a step of detecting an inversion of the fourth direct current level of the input signal from an inversion of the offset.

In the foregoing arrangement, since the difference between the input signal and the direct current level which has previously been detected is properly converted so as to be outputted as the offset, it is possible to precisely carry out the binarization without varying the direct current level detected from the offset, even if the level of the input signal is kept substantially consistent for a long period of time.

That is to say, the foregoing conversion of the difference achieves the aforementioned effects, if the conversion is arranged such that 0 is outputted when the difference is within a predetermined range.

Further, even when the conversion of the difference results in outputting a predetermined amount, which is not 0, with respect to the difference falling within the predetermined limit range, it is possible to adjust the predetermined amount in order to cause the variation of the direct current level detected from the offset to be within a predetermined range, thereby correctly carrying out the binarization, if it has been identified that the maximum limit of the period during which the level of the input signal is kept substantially consistent.

In the foregoing arrangement, on the occasion of carrying out the binarization in accordance with the difference between the input signal and the detected direct current level, the binarization may be carried out by, for instance, comparing the generated signal, which is generated by adding a signal equivalent to an inversion of the direct current level to the input signal, with 0-level as a predetermined level voltage. In this case, as in the foregoing description, it may be arranged such that an amount of an inversion of the difference is outputted as an offset, and an amount of an inversion of the direct current level of the input signal is detected from the offset. Alternatively, it may be arranged such that the offset obtained from the difference is outputted, and the direct current level obtained from the offset is inverted and then outputted.

As described above, for instance, the binarization may be carried out by simply comparing the input signal with the direct current level.

For a fuller understanding of the nature and advantages of the invention, reference should be made to the ensuing detailed description taken in conjunction with the accompanying drawings.

DESCRIPTION OF THE EMBODIMENTS

First Embodiment

The following will describe an embodiment in accordance with the present invention.

A wireless communication device regarding the present invention receives a radio signal (radio frequency (RF) signal) modulated by methods such as the frequency shift keying (FSK), then demodulating the same. The wireless communication devices can conduct, for instance, two-way transmission of radio signals under the Bluetooth® standard. Alternatively, the wireless communication device can carry out wireless communication using a spread spectrum method.

The wireless communication device includes a binarizing circuit in accordance with the present invention. The binarizing circuit carries out binarization in accordance with the difference between an input signal and a direct current level generated from the input signal.

That is to say, for instance, provided that the frequency component not less than a predetermined frequency is an alternating current component and the remaining frequency component is a direct current component, the binarizing circuit takes out the direct current component from the input signal, and carries out the binarization by comparing the input signal with the direct current component.

Further, as discussed later, the binarizing circuit converts the difference, between the input signal and a previous direct current level (direct current component) which has been generated from a previous input signal, into an offset so as to output the same, and a present direct current level is generated from this offset. More specifically, on the occasion of detecting the direct current level of the input signal from the offset, in this embodiment, an inversion of the direct current level of the input signal is detected from an inversion of the offset.

Figure 2:
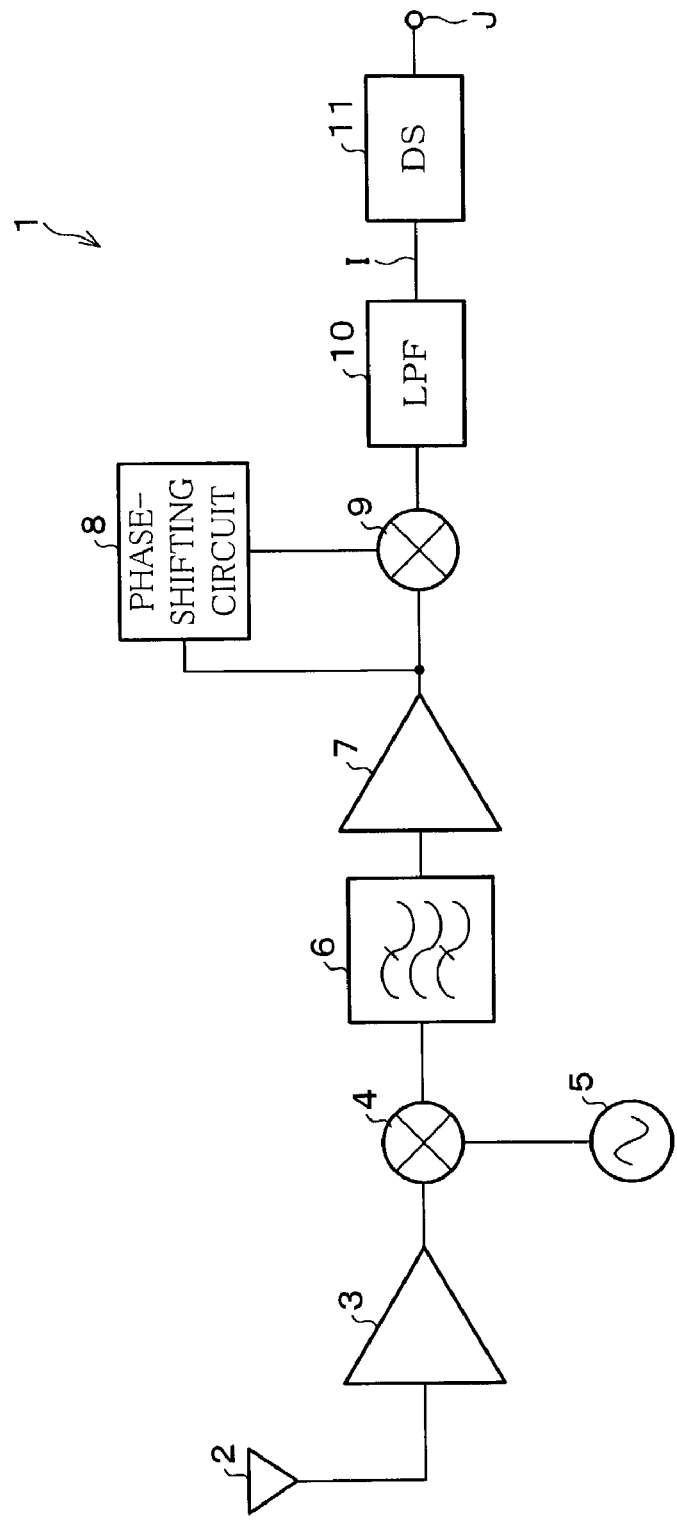
FIG. 2 is a block diagram, illustrating an example of a wireless communication device of the present invention, including the binarizing circuit.

Referring to FIG. 2, an arrangement of the wireless communication device 1 is described as below.

FIG. 2 only describes a general arrangement of a radio receiving device of the wireless communication device 1, in which an obtained data slicer output is transmitted to desired devices such as a control device and a memory device at a predetermined clock frequency via, for instance, a bus line (the devices and the line are not illustrated). These devices, etc. are conventionally arranged.

The wireless communication device 1 includes an aerial 2, a low noise amplifier (LNA) 3, a mixer 4, a local oscillator 5, a band-pass filter (BPF) 6, an automatic gain control (AGC) circuit 7, a phase-shifting circuit 8, a mixer 9, a low-pass filter (LPF) 10, and a binarizing circuit 11.

The aerial 2 is provided for receiving a transmitted radio signal.

The low noise amplifier 3 is provided for amplifying the radio signal received by the aerial 2.

The mixer 4 mixes an output from the low noise amplifier 3 with an output from the local oscillator 5 so as to output a signal as a result of the mixing.

The local oscillator 5 is provided for generating a local signal with a predetermined frequency.

The band-pass filter 6 takes out a desired frequency component from the signal generated by the mixing in the mixer 4, thereby outputting the frequency component.

The AGC circuit 7 adjusts the amplitude of a supplied signal to be steady, thereby outputting the same. It is noted that a limiter amplifier may be used instead of the AGC circuit 7.

The phase-shifting circuit 8 outputs a signal which is 90° out of phase with a supplied signal.

The mixer 9 mixes an output of the AGC circuit 7 with an output of the phase-shift circuit 8, so as to output a signal as a result of the mixing.

The low-pass filter 10 removes a high frequency component of a supplied signal so as to output the resultant signal as a demodulated signal (input signal) I.

The binarizing circuit 11 binarizes the supplied demodulated signal I as described below and outputs the same as a data slicer output (output signal) J.

In FIG. 2, the binarizing circuit 11 is illustrated as a data slicer (DS).

Receiving a radio signal, the wireless communication device 1 demodulates the signal so as to binarize the same, according to the operations as below.

The aerial 2 receives an RF signal, then the signal is amplified by the low noise amplifier 3.

The local oscillator 5 generates a local signal with a predetermined frequency, and by mixing the RF signal with the local signal in the mixer 4, an intermediate frequency (IF) signal is generated.

The band-pass filter 6 attenuates all frequency components in the IF signal other than a desired wave.

The IF signal is then transmitted from the band-pass filter 6 to the AGC circuit, and in this circuit the IF signal is adjusted to have a steady amplitude, thereby outputted.

The outputted signal bifurcates into two signals, and one of them is supplied to the mixer 9 for a demodulating circuit and the other of them is supplied to the phase-shifting circuit 8. The phase-shifting circuit 8 outputs a signal which is 90° out of phase with the supplied signal. The output from the phase-shifting circuit 8 and the output of the AGC circuit 7 are supplied to the mixer 9, whereby the former output is multiplied by the latter output. As a result, an analog demodulated signal is outputted from the mixer 9.

Since the analog demodulated signal includes a high frequency signal and a carrier component generated on account of the multiplication, these unnecessary components are removed by the low-pass filter 10. This low-pass filter 10 outputs a demodulated signal I as an analog demodulated output to the binarizing circuit 11.

The binarizing circuit 11 binarizes the supplied demodulated signal I so as to output a data slicer output J which is the resultant of the binarization.

Next, a specific arrangement of the binarizing circuit 11 will be described in reference to FIG. 1.

The binarizing circuit 11 is provided with an adder circuit 12, a comparator 13, and a feedback circuit 14.

The adder circuit 12 adds a supplied demodulated signal I to a feedback output M of the feedback circuit 14. The adder circuit 12 outputs a generated signal K to the comparator 13 and the feedback circuit 14.

The comparator 13 compares the supplied generated signal K with a signal with 0V (not illustrated) which performs as a predetermined level voltage, and then outputs a data slicer output J as a binarized output signal.

The feedback circuit 14 converts the supplied generated signal K into the feedback output M.

The feedback circuit 14 includes an offset canceller (offset canceller circuit) 15 and an integration circuit 16.

The offset canceller 15 is provided with computing circuits 17 and 18, a comparator circuit 19, and a switching circuit 20.

The generated signal K is supplied from the adder circuit 12 to the computing circuits 17 and 18 and the comparator circuit 19 in the offset canceller 15.

The computing circuits 17 and 18 and the comparator circuit 19 output predetermined values according to the generated signal K supplied thereto.

In this instance, whether or not an input signal falls within a predetermined threshold range between a maximum limit value A and a minimum limit value −A determines an output from the offset canceller 15 of the present embodiment, in the following manner.

The computing circuit 17 outputs a value figured out by subtracting the value of the generated signal K from the predetermined maximum limit value A. To put it another way, the computing circuit 17 outputs a value figured out by inversing the value of the generated signal K and then adding the predetermined limit value A thereto. On this account, the computing circuit 17 may include an inversion circuit which inverses the generated signal K and an adder which adds the generated signal K, whose polarity has been inverted by the inversion circuit, to the limit value A.

The computing circuit 18 outputs a value figured out by subtracting the value of a generated signal K from the predetermined limit value −A. To put it another way, the computing circuit 18 outputs a value figured out by inversing the value of the generated signal K and then adding the predetermined limit value −A thereto. On this account, the computing circuit 17 may include an inversion circuit which inverses the generated signal K and an adder which adds the generated signal K, whose polarity has been inverted by the inversion circuit, to the limit value −A.

The comparator 19 outputs: a predetermined value X when an input signal is between the maximum limit value A and the minimum limit value −A; a predetermined value Y when the input signal is more than the maximum limit value A; or a predetermined value Z when the input signal is less than the minimum limit value −A.

According to a signal supplied from the comparator circuit 19, the switching circuit 20 selects any one of an output from the computing circuit 17, an output from the computing circuit 18, and a signal with no electric potential, thereby outputting the selected one.

More specifically, the switching circuit 20 outputs: 0 when the value X is supplied from the comparator circuit 19; the input from the computing circuit 17 when the value Y is supplied from the comparator circuit 19; or the input from the computing circuit 18 when the value Z is supplied from the comparator circuit 19.

Thus, the operations of input/output to/from the offset canceller 15 are arranged as below. Provided that an input signal to the offset canceller 15 is IN and an output signal therefrom is OUT, OUT=−IN+A when A<IN, OUT=0 when −A≦IN≦A, and OUT=−IN−A when IN<−A.

In this arrangement, provided that the input signal is the generated signal K and the output signal is an offset canceller output L, L=−K+A when A<K, L=0 when −A≦K≦A, and L=−K−A when K<−A.

The integration circuit 16 performs integration on the offset canceller output L so as to output a feedback output M.

Here, since the feedback output M is generated by performing integration on the offset canceller output L which is a canceling signal, the direct current component of the demodulated signal I is cancelled so that the demodulated signal I is converted to the generated signal K which oscillates around 0 level.

The comparator 13 to which the generated signal K is supplied generates a data slicer output J according to the polarity of the generated signal K. That is, as the data slicer output J, the comparator 13 outputs 1 if the generated signal K is positive and outputs 0 if the generated signal K is negative.

Next, referring to FIG. 3, the output operation of the binarizing circuit 11 will be discussed.

Figure 3:
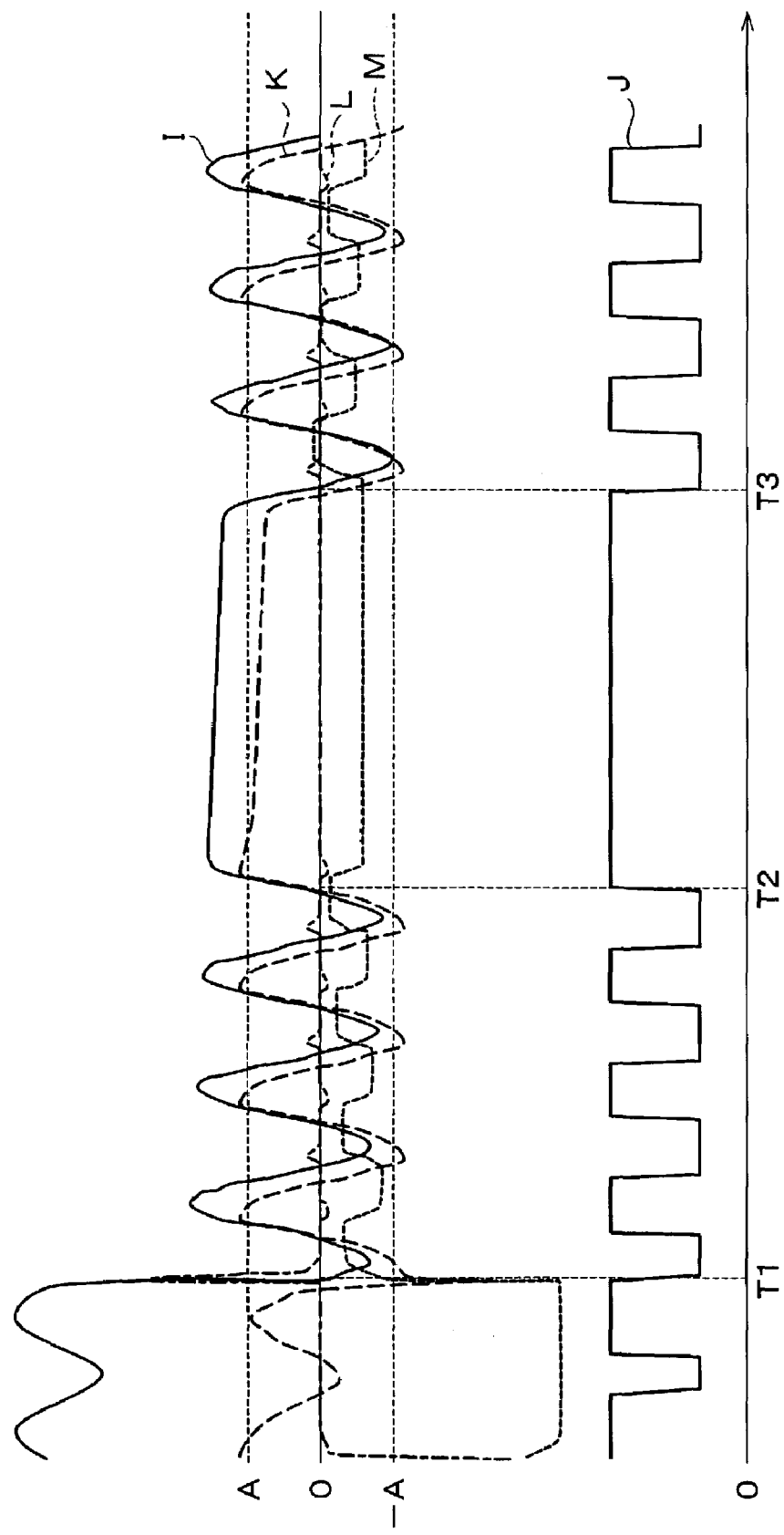
FIG. 3 is a timing chart, illustrating an example of the operation of the binarizing circuit.

In the upper half of FIG. 3, in addition to the demodulated signal I supplied to the binarizing circuit 11, the generated signal K supplied to the comparator 13, the offset canceller output L outputted from the offset canceller 15, and the feedback output M outputted from the feedback circuit 14 are illustrated.

In the lower half of FIG. 3, the data slicer output J outputted from the binarizing circuit 11 is illustrated.

Until a timing T1 in FIG. 3, the wireless communication device 1 is on standby, waiting for receiving signals.

When the demodulated signal I steeply varies as illustrated around the timing T1, the feedback output M readily follows the demodulated signal I so as to vary steeply.

When the demodulated signal I is kept at a substantially consistent level for a predetermined period of time as illustrated between timings T2 and T3, the offset canceller output L is kept at 0 so that the feedback output M does not vary. For this reason, since the generated signal K does not follow the feedback output M, the binarization is properly carried out.

As described above, the binarizing circuit 11 in accordance with the present embodiment includes: the comparator 13 which compares the generated signal K generated from the demodulated signal I with 0 level so as to produce the data slicer output J; the feedback circuit 14 which detects a direct current level of the generated signal K which has been supplied, thereby producing the feedback output M by inversing the direct current level; and the adder 12 which outputs the generated signal K obtained by adding the supplied feedback output M to the demodulated signal I.

As described above, the feedback circuit 14 includes the offset canceller 15 which produces an output in accordance with the supplied generated signal K and a pair of the maximum limit value A and the minimum limit value −A which determine a predetermined threshold range, the feedback circuit 14 outputting any one of: 0 as the offset canceller output L when the generated signal K is within the predetermined range; a value which is an inversion of the difference between the generated signal K and the maximum limit value A, as the offset canceller L, when the generated signal K is more than the maximum limit value A; and a value which is an inversion of the difference between the generated signal K and the minimum limit value −A, as the offset canceller L, when the generated signal K is less than the minimum limit value −A. Also, the feedback circuit 14 further includes the integration circuit 16 which outputs a value figured out by performing integration on the supplied offset canceller output L, as the feedback output M.

With this arrangement, it is possible to carry out binarization properly even if the demodulated signal I which is the input signal is kept at a substantially consistent level for a long period of time.

Second Embodiment

The following will describe another embodiment of the present invention.

Figure 4:
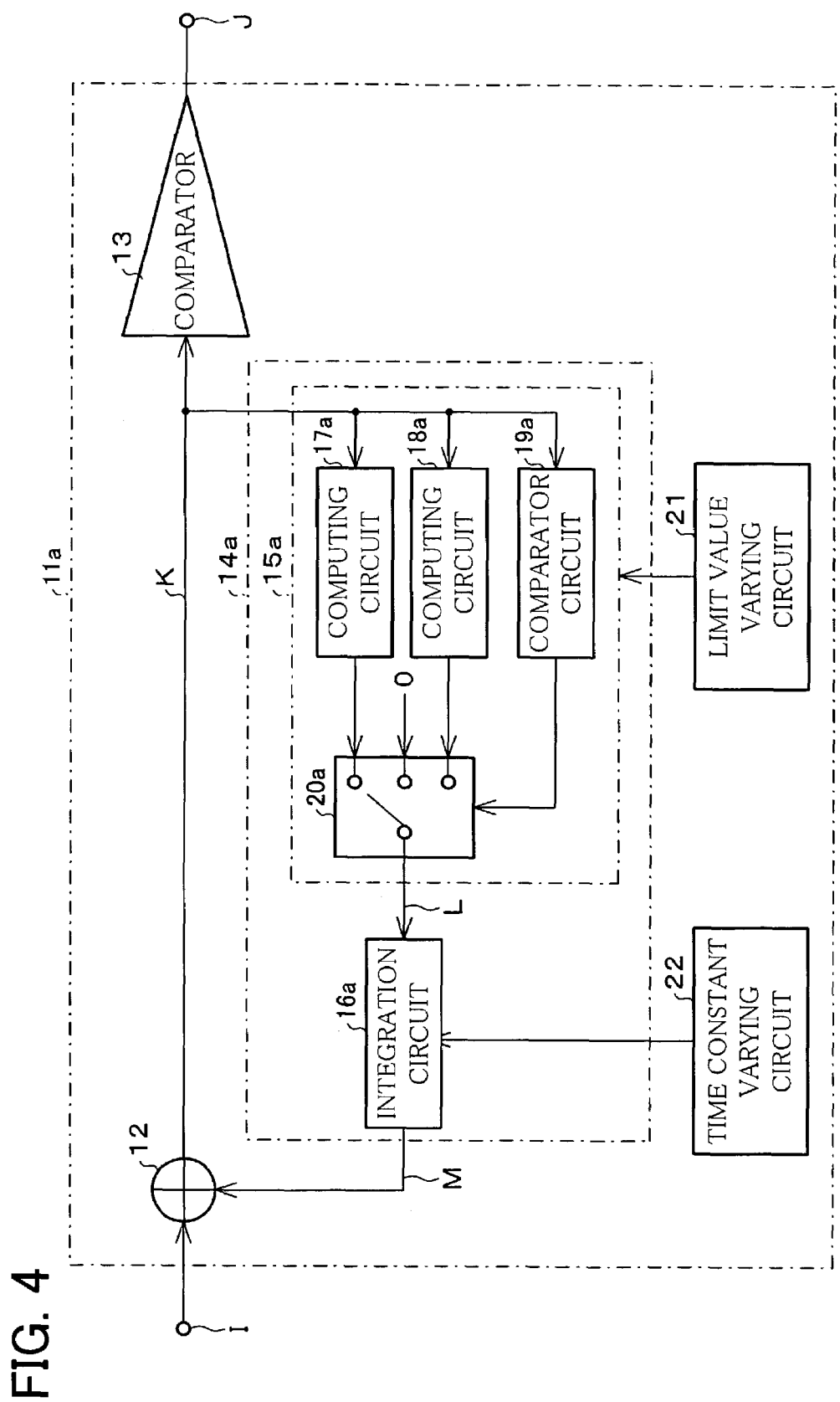
FIG. 4 is a block diagram, illustrating another embodiment of the binarizing circuit in accordance with the present invention.

A binarizing circuit 11a in accordance with the present embodiment is, as illustrated in FIG. 4, arranged so as to be identical with the foregoing binarizing circuit 11, except that a limit value varying circuit 21 and a time constant varying circuit 22 are additionally provided.

In the following description, members having the same functions as those described above are given the same numbers, so that the descriptions are omitted for the sake of convenience.

A feedback circuit 14a in the binarizing circuit 11a includes an offset canceller 15a and an integration circuit 16a.

The limit value varying circuit 21 is provided for varying a maximum limit value A and a minimum limit value −A, these values determining a threshold range of the offset canceller 15a.

In the present embodiment, the limit value varying circuit 21 varies the maximum limit value A and the minimum limit value −A so as to cause a demodulated signal I, which is inputted to the binarizing circuit 11a, to be either more than the maximum limit value A or less than the minimum limit value −A. The limit value varying circuit 21 carries out this variation immediately after the start to supply the demodulated signal I.

Further, in the present embodiment, after a predetermined period of time has passed from the start to input the signal to the binarizing circuit 11a, the limit value varying circuit 21 varies the maximum limit value A and the minimum limit value −A so as to cause a value of the input signal to be within the threshold range between the maximum limit value A and the minimum limit value −A.

The time constant varying circuit 22 is provided for varying a time constant of the integration circuit 16a which functions as a low-pass filter.

That is to say, the integration circuit 16a performs integration on the input signal, thereby outputting the same. In this case, since the temporal variation of the input signal is dampened when outputted, it is possible to regard the integration circuit 16a as a low-pass filter. The low-pass filter removes a frequency component not less than a predetermined frequency from the input signal and outputs a frequency component less than the predetermined frequency. For this purpose, the low-pass filter is provided with a time constant corresponding to the predetermined frequency.

In the present embodiment, immediately after the start to input the signal to the binarizing circuit 11a, the time constant varying circuit 22 varies the time constant to be smaller than a time scale under which the input signal normally varies.

Further, the time constant varying circuit 22 causes the time constant to be larger than the foregoing normal time scale, after a predetermined period of time has passed from the start to input the signal to the binarizing circuit 11a.

The offset canceller 15a includes computing circuits 17a and 18a and a comparator circuit 19a for outputting a predetermined value according to a generated signal K supplied to the offset canceller 15a.

According to the maximum limit value A and the minimum limit value −A both determined by the limit value varying circuit 21, the offset canceller 15a in accordance with the present embodiment outputs a predetermined value in the following manner.

The computing circuit 17a outputs a value figured out by subtracting the value of the generated signal K from the maximum limit value A which has been determined. To put it another way, the outputted value is equivalent to the sum of an inversion of the generated signal K and the maximum limit value A.

The computing circuit 18a outputs a value figured out by subtracting a generated signal K from the minimum limit value −A. To put it another way, the outputted value is equivalent to the sum of an inversion of the generated signal K and the minimum limit value −A.

The comparator circuit 19a outputs: a predetermined value X when an input signal is between the maximum limit value A and the minimum limit value −A; a predetermined value Y when the input signal is more than the maximum limit value A; or a predetermined value Z when the input signal is less than the minimum limit value −A.

A switching circuit 20a selects any one of an output from the computing circuit 17a, an output from the computing circuit 18a, and a signal with no electric potential, thereby outputting the selected one.

More specifically, the switching circuit 20a outputs: 0 when the value X is supplied from the comparator circuit 19a; the input from the computing circuit 17 when the value Y is supplied from the comparator circuit 19a; or the input from the computing circuit 18a when the value Z is supplied from the comparator circuit 19a.

The integration circuit 16a performs integration on a supplied offset canceller output L with respect to the time constant determined by the time constant varying circuit 22, and then outputs a feedback output M.

Other arrangements and operations of the binarizing circuit 11a are identical with those of the foregoing binarizing circuit 11.

Thus, if, for instance, the limit value varying circuit 21 causes the maximum limit value A and the minimum limit value −A to be consistent and the time constant varying circuit 22 causes the time constant to be consistent, the binarizing circuit 11a can perform binarization similar to the binarization by the foregoing binarizing circuit 11.

As in the foregoing description, the binarizing circuit 11a, which includes the limit value varying circuit 21 for varying the maximum limit value A and the minimum limit value −A, can perform binarization more precisely by appropriately varying the maximum limit value A and the minimum limit value −A.

That is to say, immediately after the start to input the signal to the binarizing circuit 11a, the limit value varying circuit 21 varies the maximum limit value A and the minimum limit value −A to cause the input signal to be either more than the maximum limit value A or less than the minimum limit value −A. With this arrangement, it is possible to cause the generated signal K to swiftly follow the variation of the demodulated signal I which is the input signal.

Further, as described above, after a predetermined period of time has passed from the start to input the signal to the binarizing circuit 11a, the limit value varying circuit 21 varies the maximum limit value A and the minimum limit value −A so as to cause the input signal to be within the threshold range between the maximum limit value A and the minimum limit value −A. With this arrangement, even if the demodulated signal I which is the input signal is kept at a substantially consistent level, the generated signal K does not follow the variation of the demodulated signal I so that a stable output can be obtained.

Moreover, since the binarizing circuit 11a is provided with the time constant varying circuit 22 which varies the time constant of the integration circuit 16a, it is possible to carry out binarization more precisely by properly varying the time constant.

That is to say, immediately after the start to input the demodulated signal I which is the input signal to the binarizing circuit 11a, the time constant varying circuit 22 varies the time constant to be smaller than the value of the time scale under which the input signal normally varies. With this arrangement, it is possible to cause the generated signal K to promptly follow the variation of the input signal, so as to properly vary the data slicer output J.

Further, after a predetermined period of time has passed from the start to input the signal, the time constant varying circuit 22 varies the time constant to be larger than the value of the normal time scale. With this arrangement, even if the input signal is kept substantially consistent, it is possible to obtain the data slicer output J as a stable output signal, without causing the generated signal K to follow the input signal.

Third Embodiment

The following will describe a further embodiment of the present invention.

Figure 5:
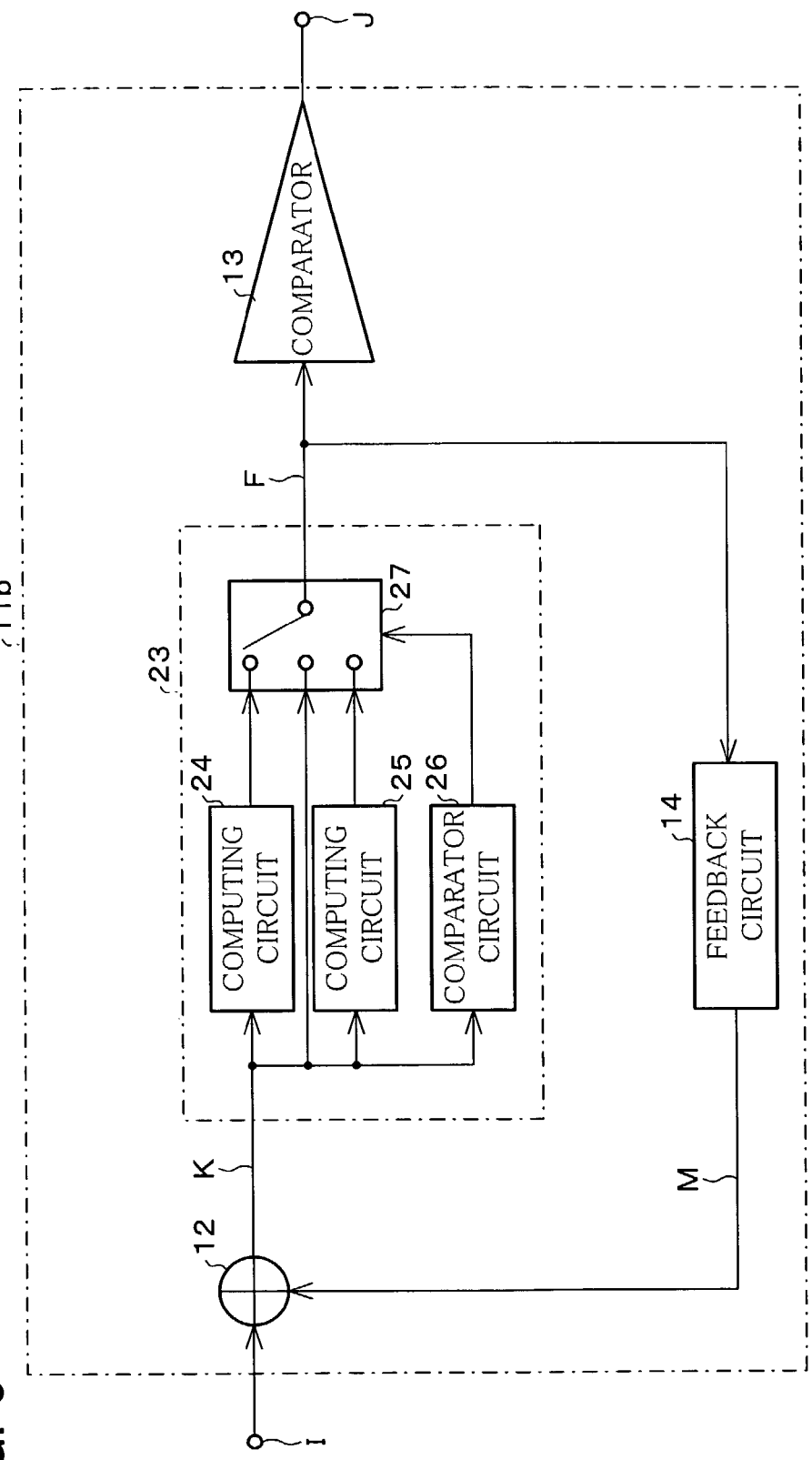
FIG. 5 is a block diagram, illustrating a further embodiment of the binarizing circuit in accordance with the present invention.

A binarizing circuit 11b in accordance with the present embodiment is, as FIG. 5 illustrates, arranged so as to be identical with the foregoing binarizing circuit 11, except that an output restraint circuit 23 is additionally provided.

In the following description, members having the same functions as those described above are given the same numbers, so that the descriptions are omitted for the sake of convenience.

The output restraint circuit 23 receives a generated signal K generated from a demodulated signal I which is an input signal. The value of this generated signal K is termed a generated value. The output restraint circuit 23 is provided for decreasing the amplitude of the generated signal K. More specifically, a below-mentioned restraining degree, a maximum restraining value and a minimum restraining value are determined and the amplitude of the generated signal K is decreased in accordance with these determined values, so that a restrained output value F is outputted.

The output restraint circuit 23 includes computing circuits 24 and 25, a comparator circuit 26, and a switching circuit 27.

The computing circuit 24 outputs a value figured out by (i) subtracting a maximum restraining value D from the value of the generated signal K, (ii) multiplying the result of (i) by a restraining degree B, and (iii) adding the maximum restraining value D to the result of (ii).

The comparator circuit 26 outputs: a value X when the generated signal K is between the maximum restraining value D and the minimum restraining value −D; a value Y when the generated signal K is larger than the maximum restraining value D; or a value Z when the generated signal K is smaller than the minimum restraining value −D.

The comparator circuit 26 outputs: a value X when the generated signal K is smaller than the maximum restraining value D and is larger than the minimum restraining value −D; a value Y when the generated signal K is larger than the maximum restraining value D; or a value Z when the generated signal K is smaller than the minimum restraining value −D.

The switching circuit 27 outputs: a signal supplied from the adder circuit 12 when the comparator circuit 26 outputs the value X; a signal supplied from the computing circuit 24 when the comparator circuit 26 outputs the value Y; or a signal supplied from the computing circuit 25 when the comparator circuit 26 outputs the value Z.

In a word, the output/input operations of the output restraint circuit 23 are arranged in the following manner. Provided that a signal supplied to the output restraint circuit 23 is IN and a signal outputted from the output restraint circuit 23 is OUT, OUT=B·(IN−D)+D when D<IN, OUT=IN when −D≦IN≦D, and OUT=B·(IN+D)−D when IN<−D.

Other arrangements and operations of the binarizing circuit 11b are identical with those of the foregoing binarizing circuit 11.

Thus, when the restraining degree B of the binarizing circuit 11b is determined so as to be 1, the input to the output restraint circuit 23 is equal to the output therefrom and this enables the binarizing circuit 11b to carry out binarization similar to the binarization by the foregoing binarizing circuit 11.

Further, in the binarizing circuit 11b, it is possible to cause an absolute value of an output restraining value F, which is supplied from the output restraint circuit 23, to be smaller than an absolute value of the generated signal K supplied to the output restraint circuit 23, by determining the restraining degree B to be less than 1. For this reason, it is possible to decrease the amplitude of the generated signal K and output the same.

If the amplitude of the input signal is properly decreased in accordance with the characteristics of the signal, it is possible to reduce the frequency of errors, thereby precisely carrying out binarization.

That is to say, the input signal occasionally has an unnecessarily high amplitude, and if binarization is simply carried out in accordance with the high amplitude, errors could occur.

In this case, it is possible to carry out precise and reliable binarization by decreasing this amplitude using the foregoing output restraint circuit 23.

Fourth Embodiment

The following will describe yet another embodiment of the present invention.

Figure 6:
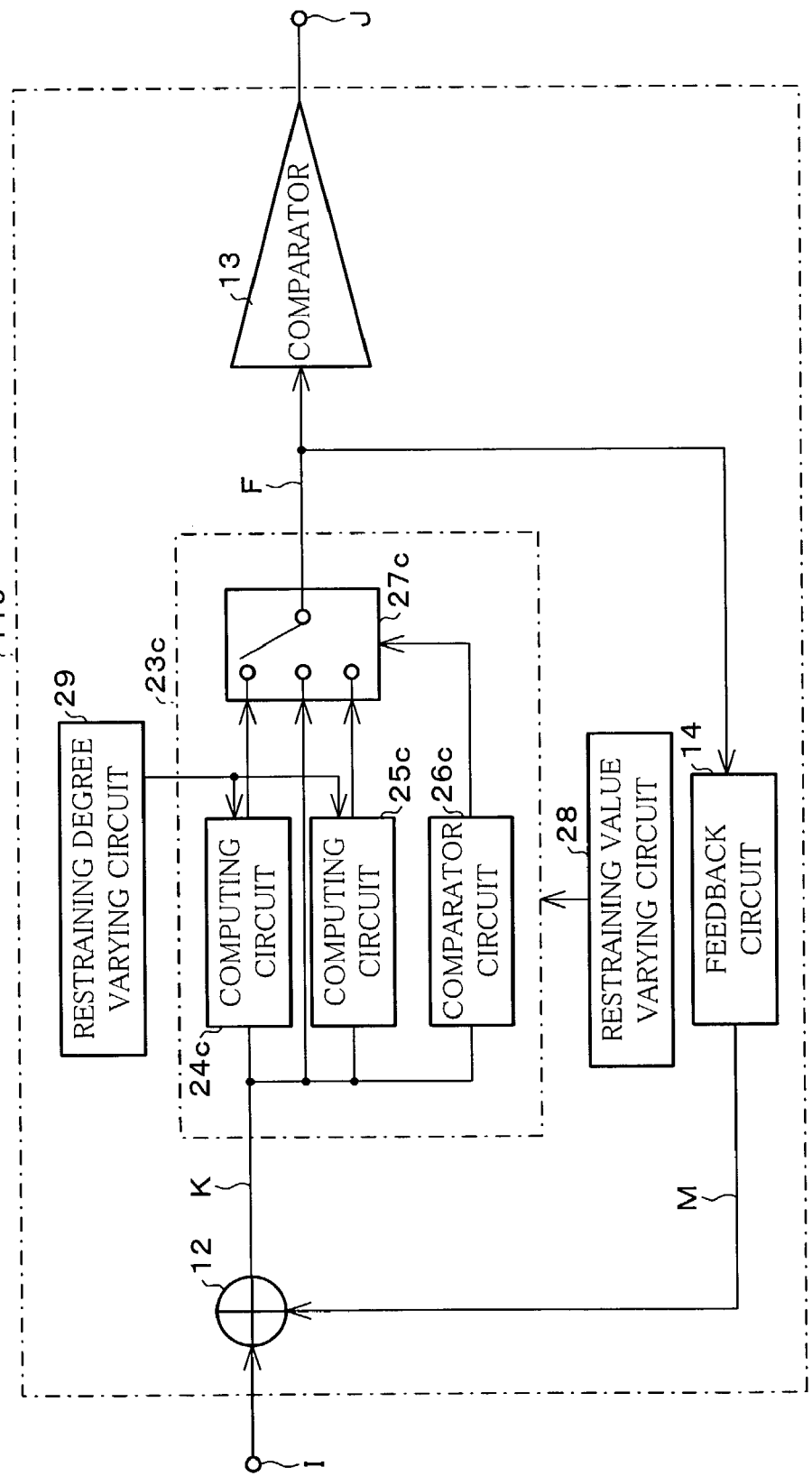
FIG. 6 is a block diagram, illustrating yet another embodiment of the binarizing circuit in accordance with the present invention.

A binarizing circuit 11c in accordance with the present embodiment is, as illustrated in FIG. 6, arranged so as to be identical with the foregoing binarizing circuit 11, except that a restraining value varying circuit 28 and a restraining degree varying circuit 29 are additionally provided.

In the following description, members having the same functions as those described above are given the same numbers, so that the descriptions are omitted for the sake of convenience.

The restraining value varying circuit 28 is provided for varying a maximum restraining value D and a minimum restraining value −D.

In the present embodiment, immediately after the start to input a demodulated signal I to the binarizing circuit 11c, the restraining value varying circuit 28 varies the maximum restraining value D and the minimum restraining value −D to cause a generated value of the generated signal K to be either more than the maximum restraining value D or less than the minimum restraining value −D.

Further, after a predetermined period of time has passed from the start to input the signal to the binarizing circuit 11c, the restraining value varying circuit 28 varies the maximum restraining value D and the minimum restraining value −D to cause the generated value to be within a restraining range between the maximum restraining value D and the minimum restraining value −D.

The restraining degree varying circuit 29 is provided for varying a restraining degree B.

In the present embodiment, immediately after the start to input the demodulated signal I to the binarizing circuit 11c, the restraining degree varying circuit 29 causes the restraining degree to be decreased.

Further, after the predetermined time has passed from the start to input the signal to the binarizing circuit 11c, the restraining degree varying circuit 29 increases the restraining degree.

In the present arrangement, the restraining value varying circuit 28 varies the maximum restraining value D and the minimum restraining value −D as described above, and outputs the varied values to computing circuits 24c and 25c and a comparator circuit 26c in the output restraint circuit 23c.

Also, the restraining degree varying circuit 29 varies the restraining degree B as above, and outputs the varied degree B to the computing circuits 24c and 25c.

The computing circuits 24c and 25c receives (i) the maximum restraining value D and the minimum restraining value −D from the restraining value varying circuit 28 and (ii) the restraining degree B from the restraining degree varying circuit 29. Then the computing circuits 24c and 25c output predetermined values, these outgoing values being calculated in the same fashion as, for instance, the values outputted from the computing circuits 24 and 25 in FIG. 5.

The comparator circuit 26c receives the maximum restraining value D and the minimum restraining value −D from the restraining value varying circuit 28, and outputs values corresponding to the supplied values, the outgoing values being calculated in the same fashion as the values outputted from the comparator circuit 26 in FIG. 5.

Other arrangements and operations of the binarizing circuit 11c are identical with those of the foregoing binarizing circuit 11.

Thus, if, for instance, the restraining value varying circuit 28 causes the maximum restraining value D and the minimum restraining value −D to be consistent and the restraining degree varying circuit 29 causes the restraining degree B to be consistent such as B=1, the binarizing circuit 11c can perform binarization similar to the binarization by the foregoing binarizing circuit 11b.

Further, the binarizing circuit 11c can perform the binarization more precisely, by, for instance, properly varying the maximum restraining value D and the minimum restraining value −D using the restraining value varying circuit 28 or properly varying the restraining degree B using the restraining degree varying circuit 29.

That is to say, immediately after the start to input the demodulated signal I to the binarizing circuit 11c, the restraining value varying circuit 28 varies the maximum restraining value D and the minimum restraining value −D so as to cause the generated value of the generated signal K to be either more than the maximum restraining value D or less than the minimum restraining value −D. With this arrangement, the output restraining value F promptly responds to the variation of the input signal, and this also varies the value of the generated signal K. Consequently, it is possible to properly vary the data slicer output J.

Further, after the predetermined time has passed from the start to input the signal to the binarizing circuit 11c, the restraining value varying circuit 28 varies the maximum restraining value D and the minimum restraining value −D so as to cause the generated value to be within the restraining range between the maximum restraining value D and the minimum restraining value −D. With this arrangement, even if the input signal is kept at a substantially consistent level, it is possible to stably obtain the data slicer output J without causing the generated signal K to follow the consistent level and the output restraining value F to be varied.

Also, immediately after the start to input the signal to the binarizing circuit 11c, the restraining degree varying circuit 29 decreases the restraining degree B. With this arrangement, it is possible to cause the generated signal K and the data slicer output J to properly follow the variation of the input signal.

After the predetermined time has passed from the start to input the signal to the binarizing circuit 11c, the restraining degree varying circuit 29 increases the restraining degree B, and this enables to stably obtain the data slicer output J without varying the output restraining value F and the generated signal K.

Fifth Embodiment

The following will describe still another embodiment of the present invention.

Figure 1:
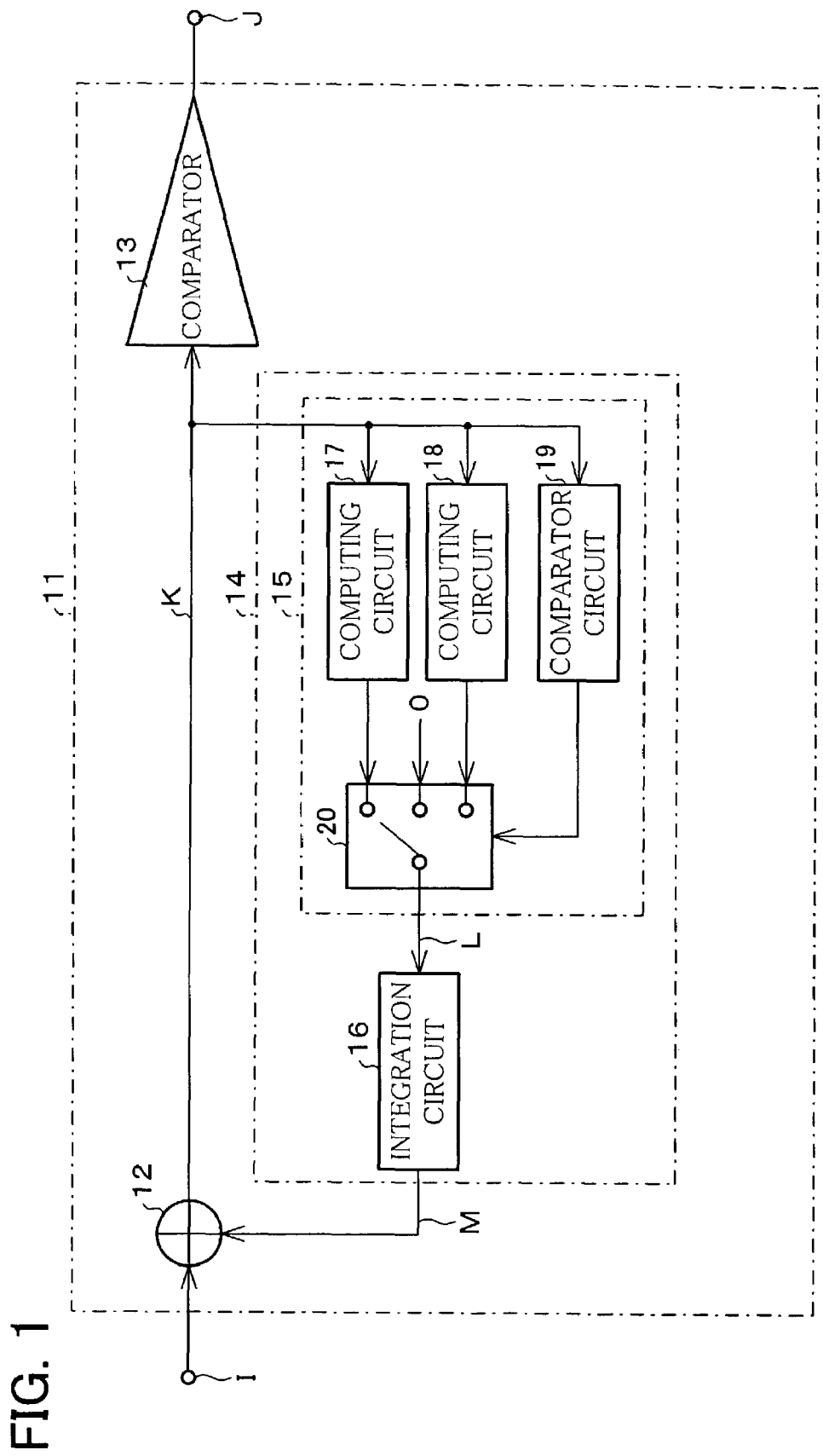
FIG. 1 is a block diagram, illustrating an embodiment of a binarizing circuit in accordance with the present invention.
Figure 7:
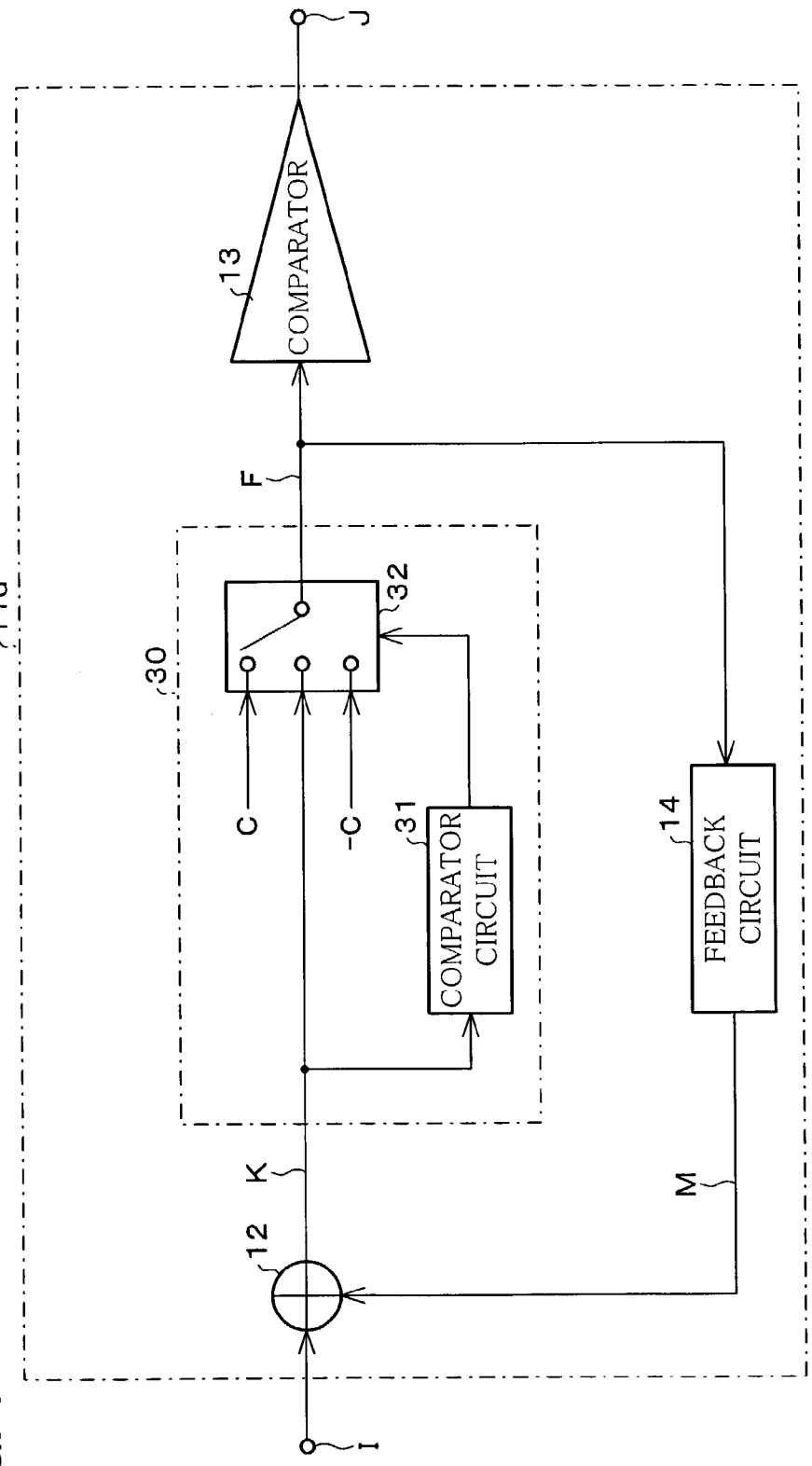
FIG. 7 is a block diagram, illustrating still another embodiment of the binarizing circuit in accordance with the present invention.

A binarizing circuit 11d in accordance with the present embodiment is, as illustrated in FIG. 7, arranged so as to be identical with the foregoing binarizing circuit 11 in FIG. 1, except that an output hold circuit 30 is additionally provided.

In the following description, members having the same functions as those described above are given the same numbers, so that the descriptions are omitted for the sake of convenience.

The output hold circuit 30 restrains the amplitude of a generated signal K, which is generated from an input signal, to be certainly within a predetermined cutoff range, so as to output the restrained signal as a cutoff output value F. The cutoff range is determined by a maximum cutoff value C and a minimum cutoff value −C.

Further, as discussed later, the output hold circuit 30 corresponds to the foregoing output restraint circuits 23 and 23c where the restraining degree B=0.

The output hold circuit 30 is provided with a comparator circuit 31 and a switching circuit 32.

The comparator circuit 31 outputs: a value X when the input signal is between the maximum cutoff value C and the minimum cutoff value −C; a value Y when the input signal is larger than the maximum cutoff value C; or a value Z when the input signal is smaller than the minimum cutoff value −C.

The switching circuit 32 outputs: an output from an adder circuit 12 when the output from the comparator circuit 31 is X; the value C when the output from the comparator circuit 31 is Y; or the value −C when the output from the comparator circuit 31 is Z.

In summary, the input/output operations of the output hold circuit are arranged in the following manner. Provided that a signal inputted to the output hold circuit 30 is IN and a signal outputted from the output hold circuit 30 is OUT, OUT=C when C<IN, OUT=IN when $-C \leq IN \leq C$, and OUT=-C when IN<-C.

In other words, this output hold circuit 30 is equivalent to the output restraint circuits 23 and 23c where the restraining degree B is determined to be 0.

Using the binarizing circuit 11d with the foregoing arrangement, it is possible to carry out binarization similar to the binarization by the foregoing binarizing circuits 11b and 11c.

Moreover, using the binarizing circuit 11d, it is possible to cause the amplitude of the cutoff output value F, which is supplied from the output hold circuit 30, to be surely within the cutoff range between the maximum cutoff value C and the minimum cutoff value -C. Thus, it is possible to certainly and precisely carry out binarization even if the amplitude of the demodulated signal I is unstable.

Sixth Embodiment

The following will describe still another embodiment of the present invention.

Figure 8:
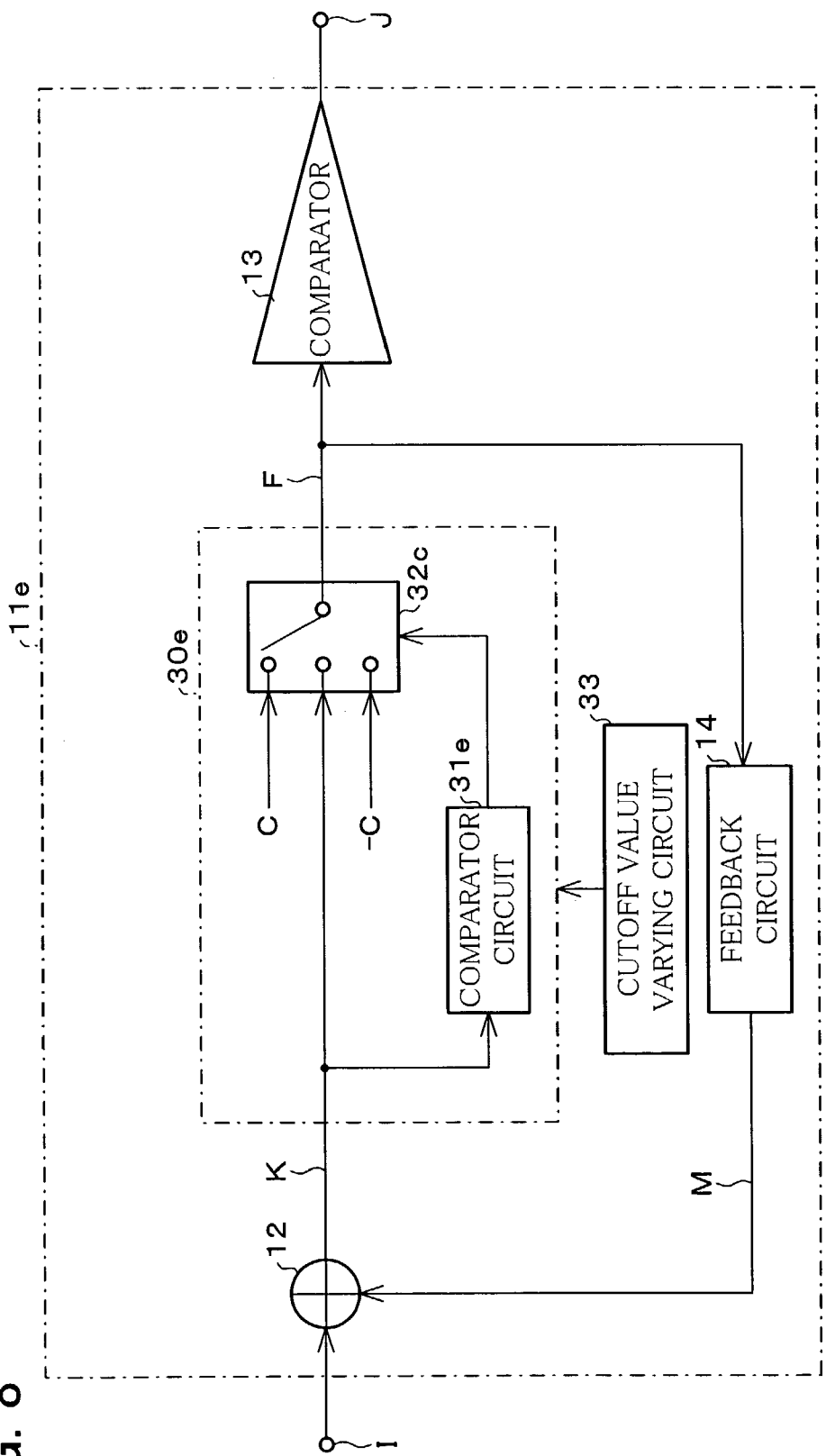
FIG. 8 is a block diagram, illustrating still another embodiment of the binarizing circuit in accordance with the present invention.

A binarizing circuit 11e in accordance with the present embodiment is, as illustrated in FIG. 8, arranged so as to be identical with the foregoing binarizing circuits, except that a cutoff value varying circuit 33 is further provided.

In the following description, members having the same functions as those described above are given the same numbers, so that the descriptions are omitted for the sake of convenience.

The cutoff value varying circuit 33 varies a maximum cutoff value C and a minimum cutoff value -C of an output hold circuit 30e.

In the present embodiment, immediately after the start to input a signal to the binarizing circuit 11e, the cutoff value varying circuit 33 varies the maximum cutoff value C and the minimum cutoff value -C in order to cause a generated value of a generated signal K, which is the signal inputted to the cutoff value varying circuit 33, to be either more than the maximum cutoff value C or less than the minimum cutoff value -C.

Further, after a predetermined period of time has passed from the start to input the signal to the binarizing circuit 11e, the cutoff value varying circuit 33 of the present embodiment varies the maximum cutoff value C and the minimum cutoff value -C so as to cause the generated value to be within a cutoff range between the maximum cutoff value C and the minimum cutoff value -C.

The cutoff value varying circuit 33 varies the maximum cutoff value C and the minimum cutoff value -C as above, so as to send the varied values C and -C to a switching circuit 32e and a comparator circuit 31e of the output hold circuit 30e.

According to the maximum cutoff value C and the minimum cutoff value -C, the comparator circuit 31e and the switching circuit 32e operate in the same way as the foregoing comparator circuit 31 and the switching circuit 32.

Other arrangements and operations of the binarizing circuit 11e are identical with those of the foregoing binarizing circuit 11d in FIG. 7.

Thus, if, for instance, the cutoff value varying circuit 33 causes the maximum cutoff value C and the minimum cutoff value -C to be consistent, the binarizing circuit 11e can perform binarization similar to the binarization by the foregoing binarizing circuit 11d.

Further, the binarizing circuit 11e can perform the binarization more precisely, by, for instance, properly varying the maximum cutoff value C and the minimum cutoff value -C using the cutoff value varying circuit 33.

That is to say, immediately after the start to input the signal to the binarizing circuit 11e, the cutoff value varying circuit 33 varies the maximum cutoff value C and the minimum cutoff value -C so as to cause the generated value to be either more than the maximum cutoff value C or less than the minimum cutoff value -C. With this arrangement, it is possible to cause a cutoff output value F of the output hold circuit 30e and the generated signal K generated from the cutoff output value F to properly follow the variation of the input signal, and consequently a proper data slicer output J can be obtained.

Further, after the predetermined time has passed from the start to input the signal to the binarizing circuit 11e, the cutoff value varying circuit 33 varies the maximum cutoff value C and the minimum cutoff value -C to cause the generated value to be within the cutoff range between the maximum cutoff value C and the minimum cutoff value -C. With this arrangement, it is possible to steadily obtain the data slicer output J without varying the cutoff output value F and the generated signal K.

Seventh Embodiment

The following will describe still another embodiment of the present invention.

Figure 9:
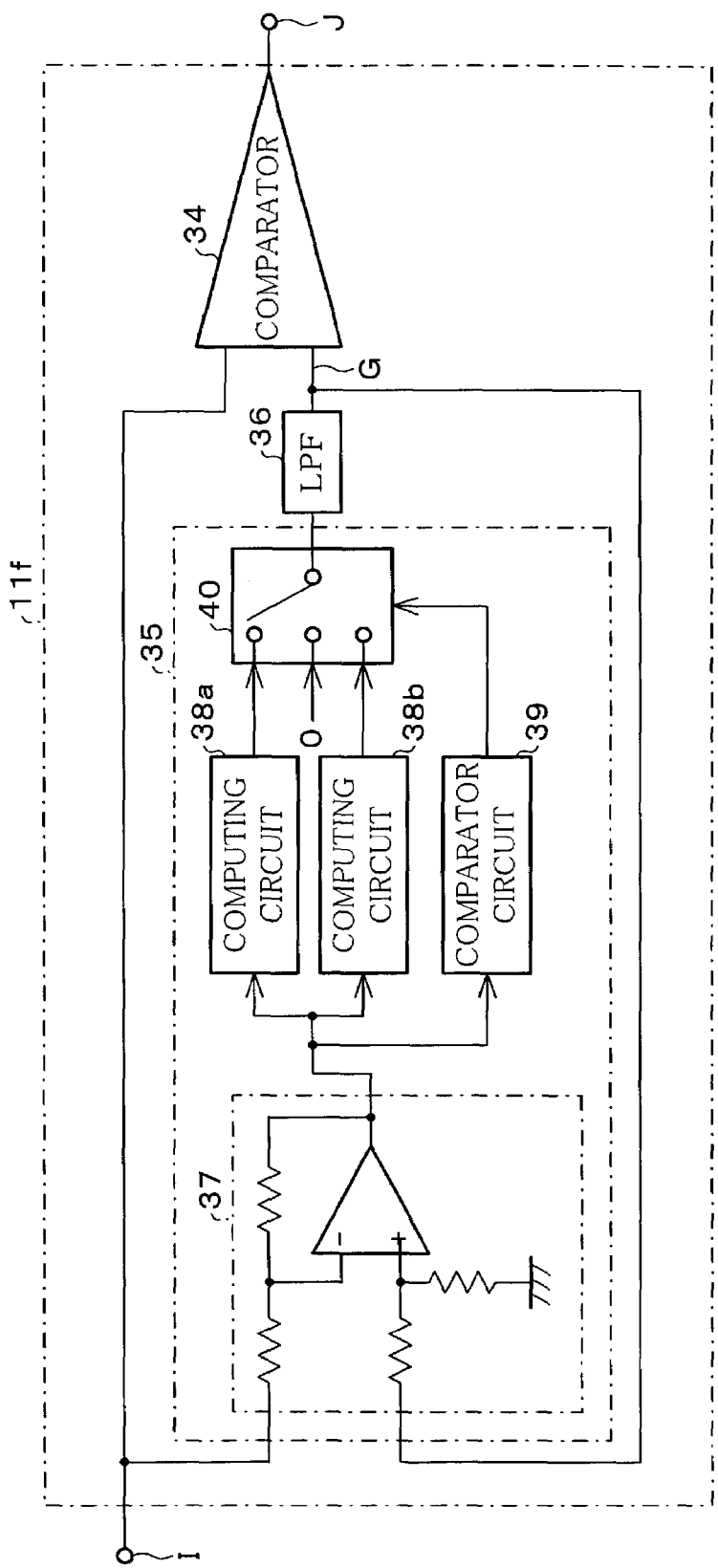
FIG. 9 is a block diagram, illustrating still another embodiment of the binarizing circuit in accordance with the present invention.
Figure 10:
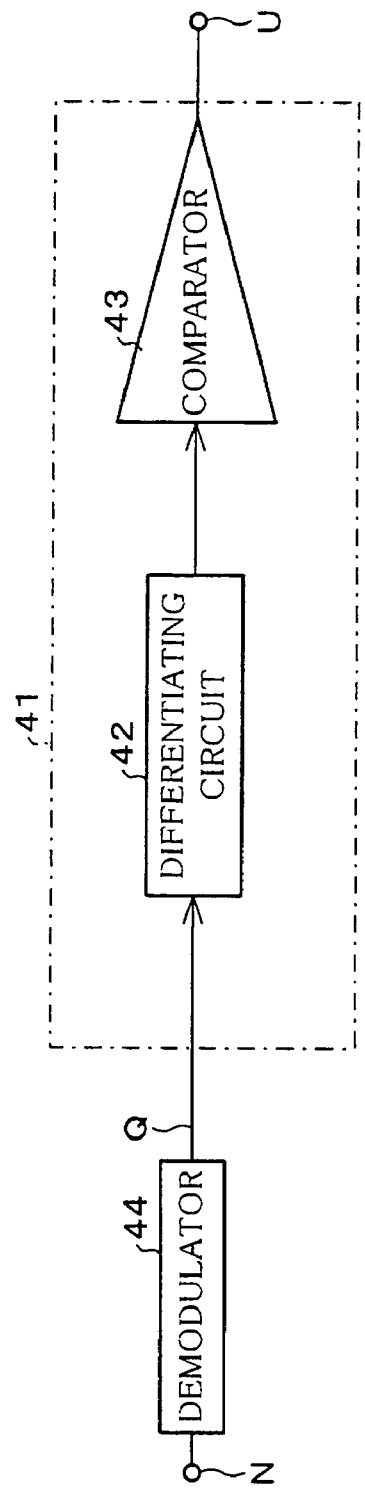
FIG. 10 is a block diagram, illustrating an example of a conventional binarizing circuit.
Figure 11:
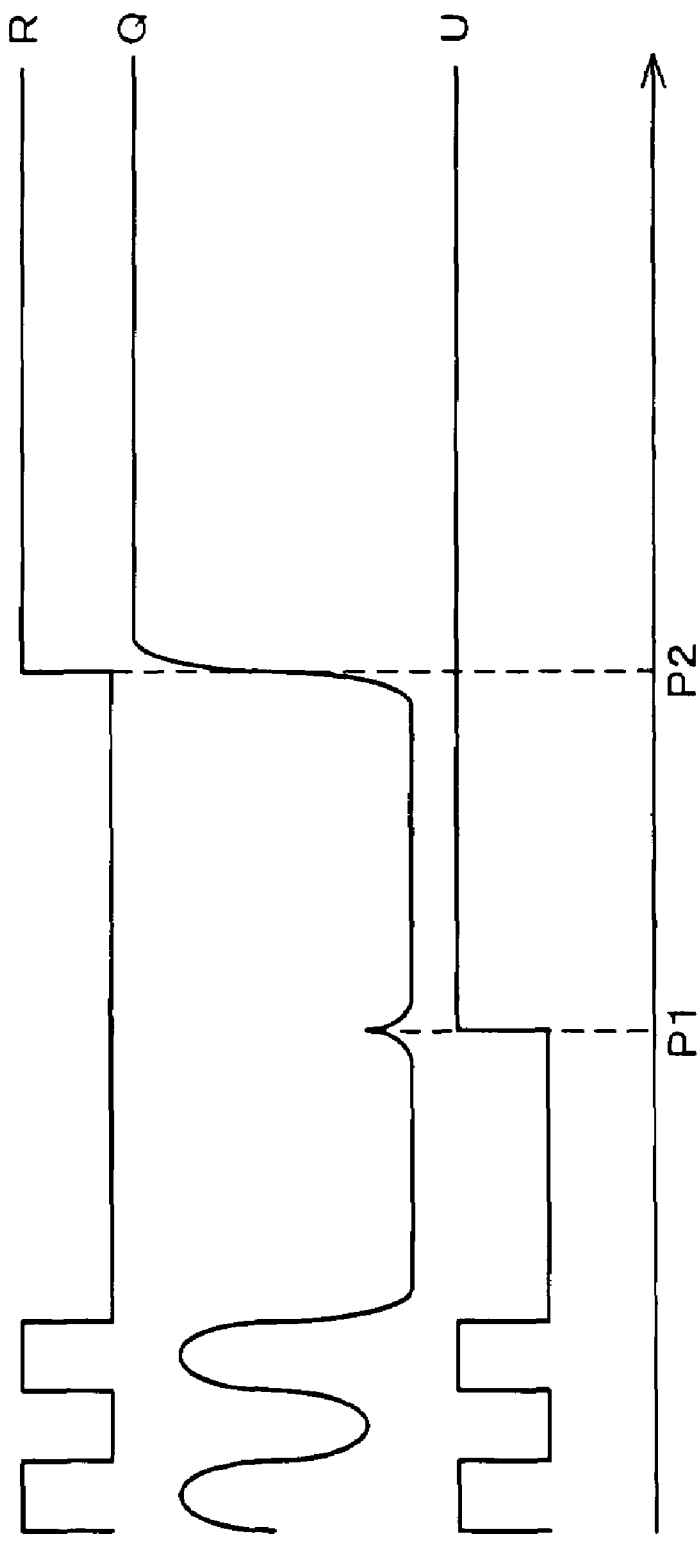
FIG. 11 is a timing chart, illustrating an example of the operation of the foregoing conventional binarizing circuit.

A binarizing circuit 11f in accordance with the present embodiment is, as illustrated in FIG. 9, arranged so as to be identical with the foregoing binarizing circuits, except that a subtracter is provided instead of an adder.

In the present embodiment, a direct current level of a demodulated signal I inputted to the binarizing circuit 11f is used as a slice level (direct current level) G so that binarization is carried out. In other words, a direct current level as an offset is generated.

Further, the binarizing circuit 11f converts the difference between the input signal and a direct current level which has previously detected from the input signal, by a predetermined method, so as to output the same as an offset. From this offset, a present direct current level of the input signal is detected.

As illustrated in FIG. 9, the binarizing circuit 11f is provided with a comparator 34, an offset generation section 35, and a low-pass filter 36.

Figure 12:
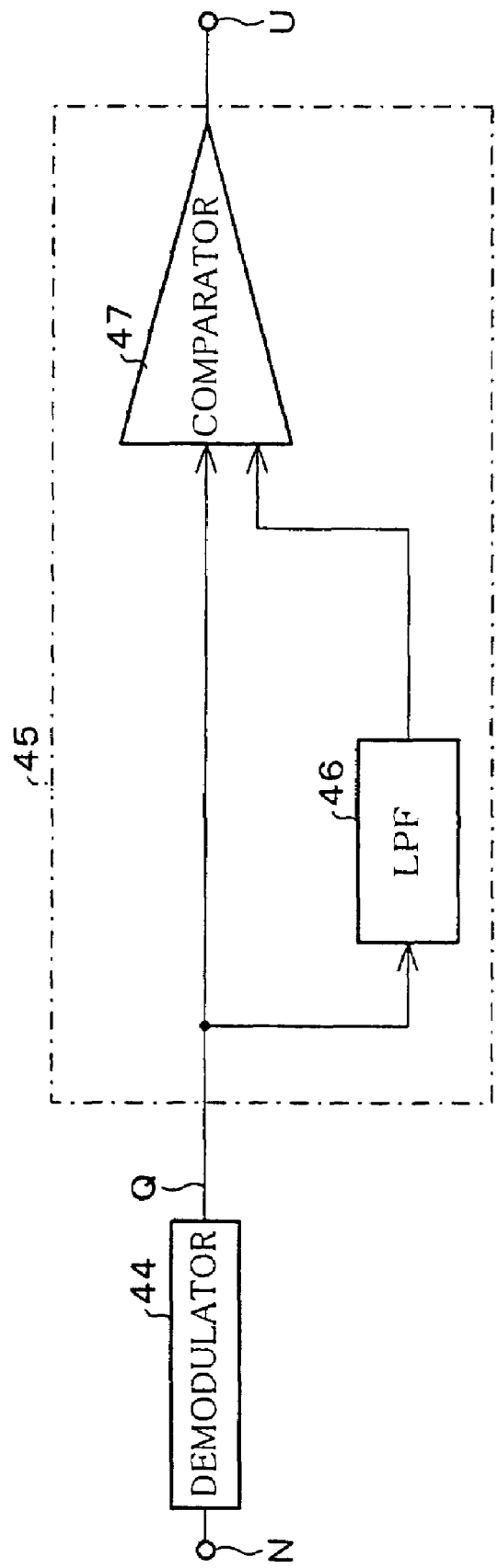
FIG. 12 is a block diagram, illustrating an example of another conventional binarizing circuit.
Figure 13:
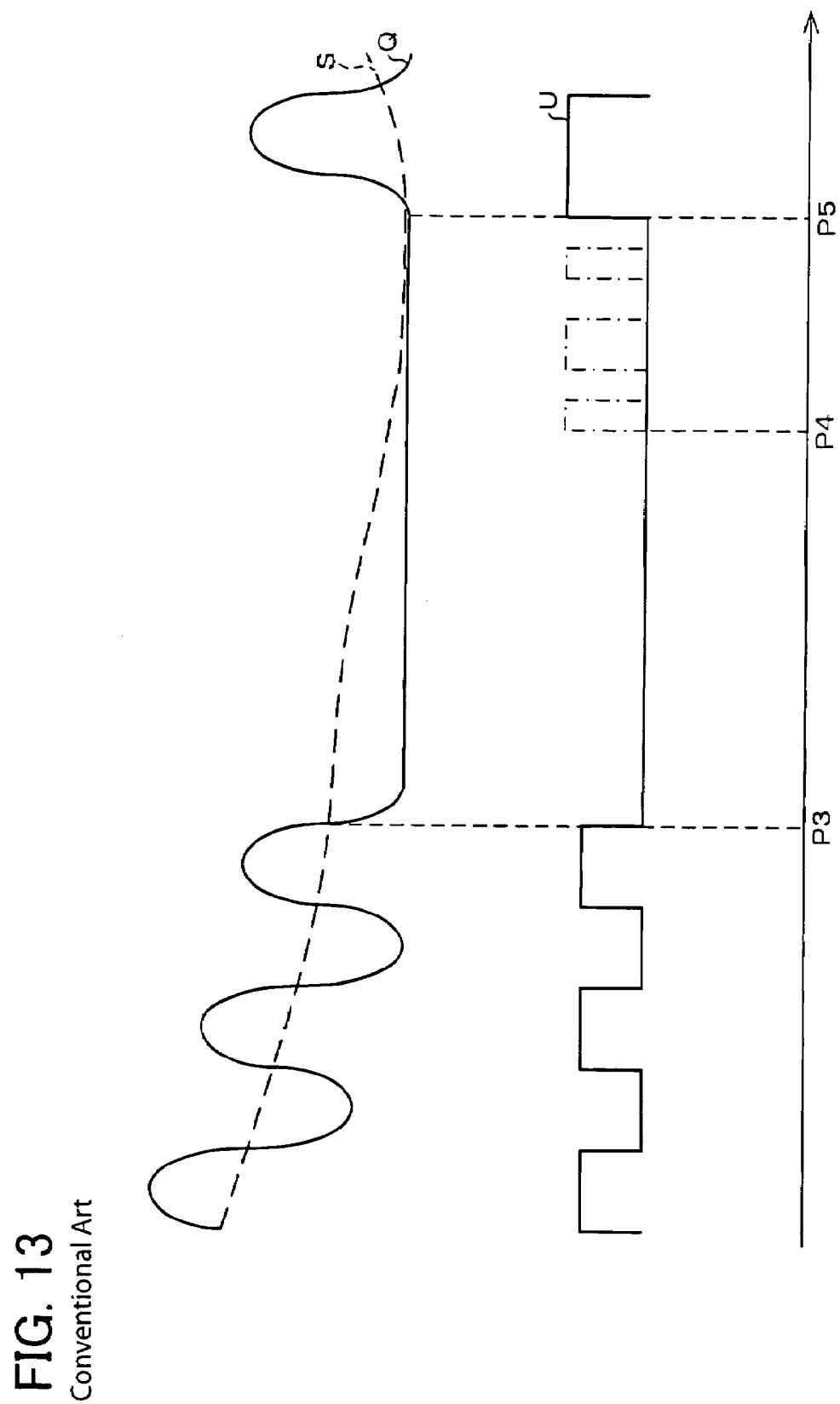
FIG. 13 is a timing chart, illustrating an example of the operation of said another conventional binarizing circuit.
Figure 14:
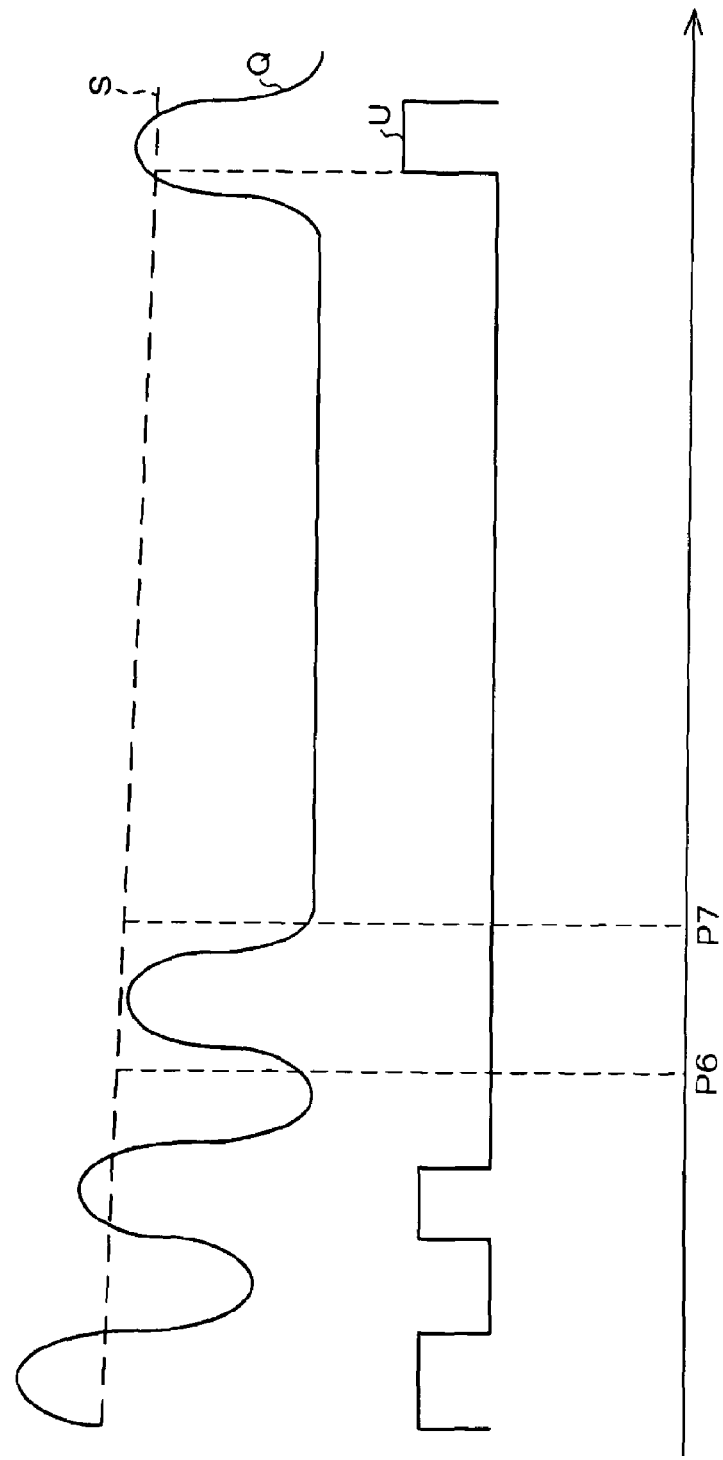
FIG. 14 is a timing chart, illustrating another example of the operation of said another conventional binarizing circuit.
Figure 15:
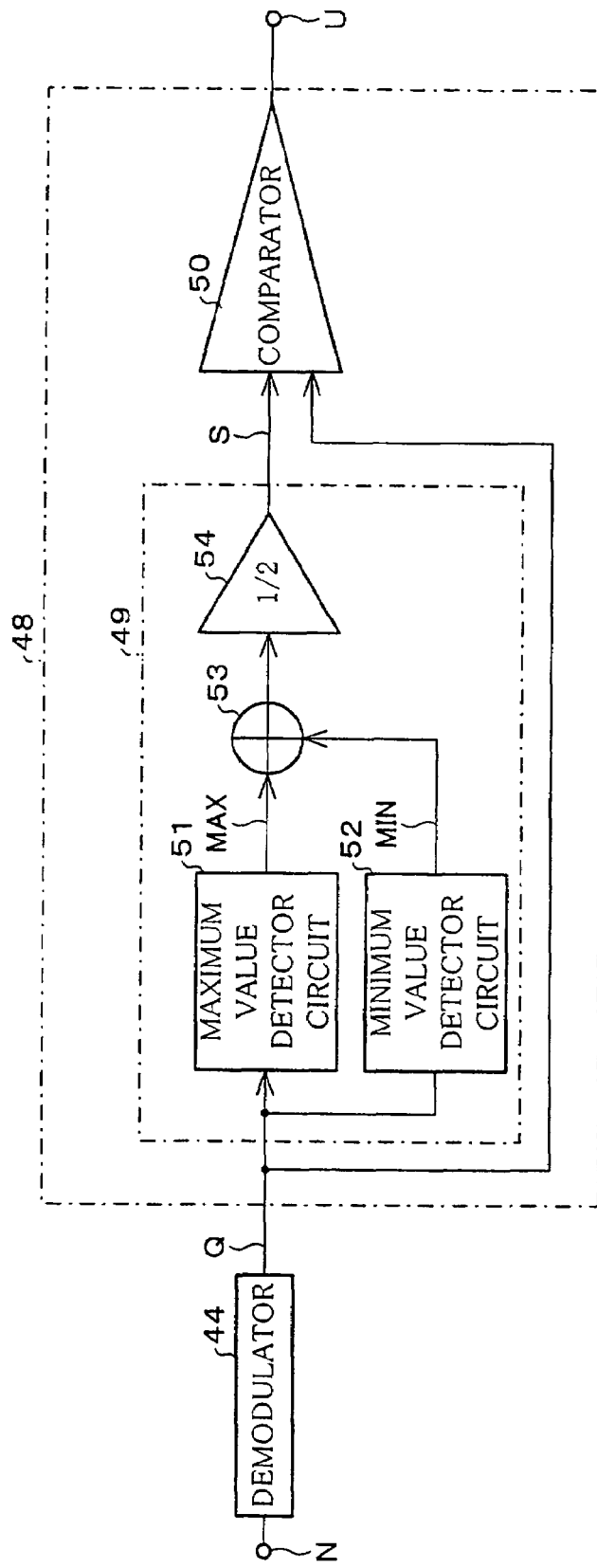
FIG. 15 is a timing chart, illustrating an example of a further conventional binarizing circuit.
Figure 16:
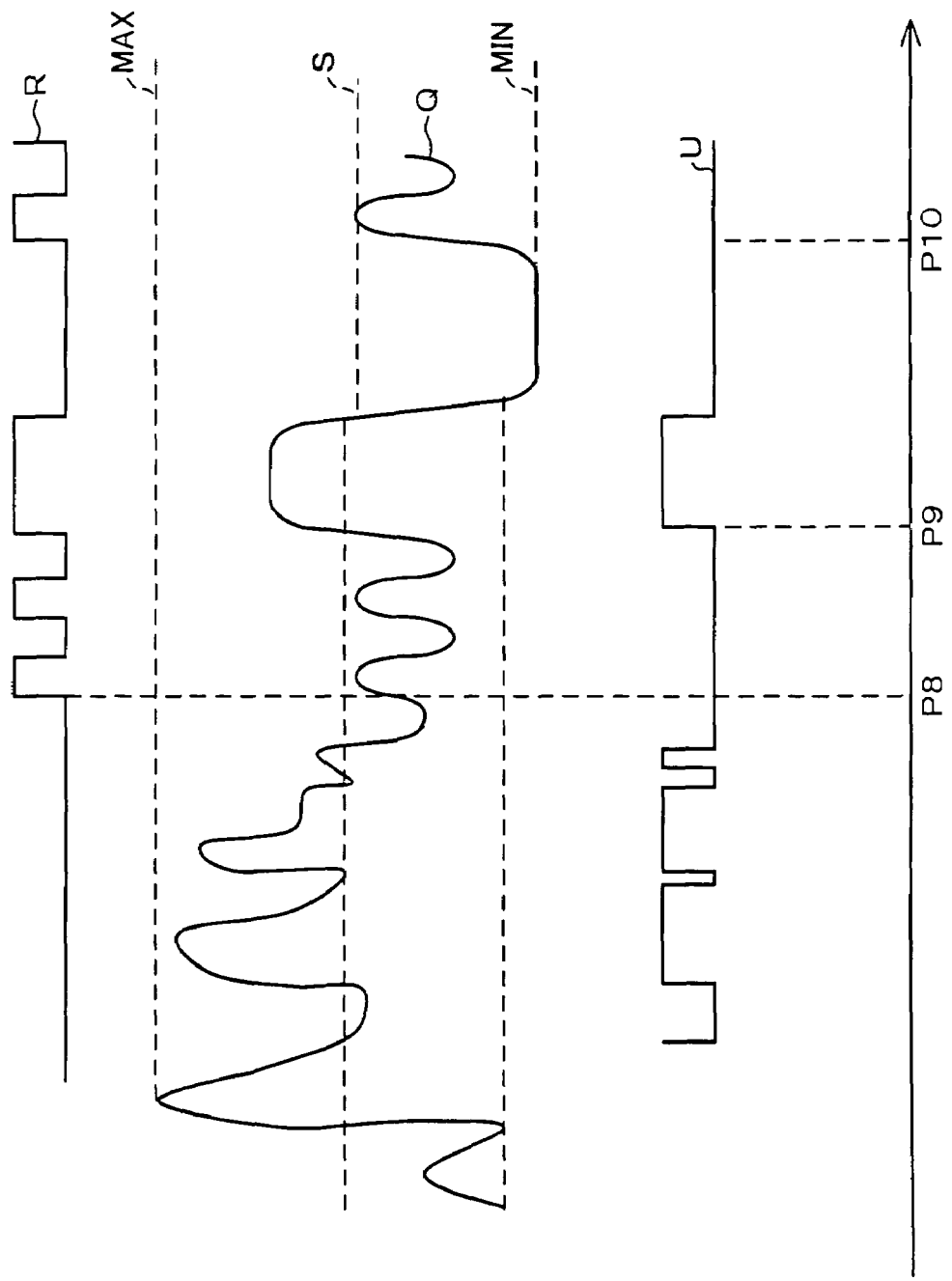
FIG. 16 is a timing chart, illustrating an example of the operation of said further conventional binarizing circuit.
Figure 17:
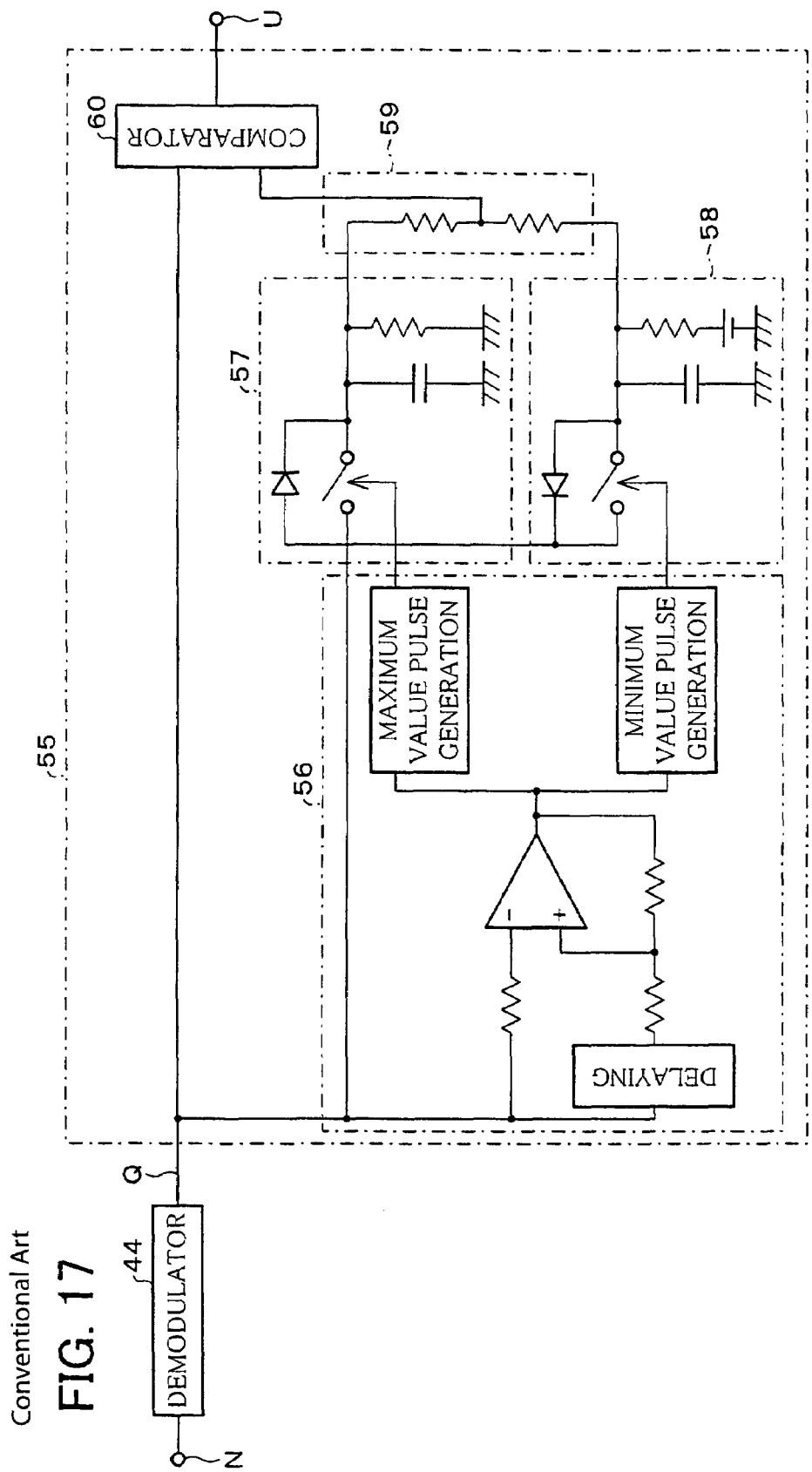
FIG. 17 is a block diagram, illustrating an example of yet another conventional binarizing circuit.

The comparison between the binarizing circuit 11f and a conventional binarizing circuit 45 in FIG. 12 indicates that these circuits are similarly arranged except that the former circuit is further provided with the offset generation section 35.

The following will describe this offset generation section 35.

The offset generation section 35 includes a subtracter 37, computing circuits 38a and 38b, a comparator circuit 39, and a switching circuit 40.

The subtracter 37 outputs the difference between two signals supplied to the same. That is, the subtracter 37 receives the demodulated signal I and a slice level G which is supplied from the low-pass filter 36, and outputs a signal I-G which is equivalent to the difference between the demodulated signal I and the slice level G.

The offset generation section 35 of the present embodiment generates an output according to the decision whether or not a signal inputted to the section 35 falls within a predetermined threshold range between a maximum limit value A and a minimum limit value -A, in the following manner.

The computing circuit 38a outputs a value figured out by subtracting the maximum limit value A from the input signal I-G.

The computing circuit 38b outputs a value figured out by subtracting the minimum limit value −A from the input signal I-G.

The comparator circuit 39 outputs: a predetermined value X when the input signal I-G is between the maximum limit value A and the minimum limit value −A; a predetermined value Y when the input signal I-G is more than the maximum limit value A; or a predetermined value Z when the input signal I-G is less than the minimum limit value −A.

According to a signal from the comparator circuit 39, the switching circuit 40 selects either an input from the computing circuit 38a, an input from the computing circuit 38b, or a signal with no electric potential, so as to output the selected one.

More specifically, the switching circuit 40 outputs: 0 when the value X is supplied from the comparator circuit 39; a signal from the computing circuit 38a when the value Y is supplied from the comparator circuit 39; or a signal from the computing circuit 38b when the value Z is supplied from the comparator circuit 39.

Thus, the input/output operations of the offset generation section 35 are arranged as below. Provided that a signal inputted to the offset generation section 35 is IN and a signal outputted therefrom is OUT, OUT=IN−A when A<IN, OUT=0 when −A≦IN≦A, and OUT=IN+A when IN<−A.

The output signal is supplied from the offset generation section 35 to the low-pass filter 36, and, for instance, integration is performed thereon. As a result, a slice level G is obtained so as to be supplied to the offset generation section 35 and the comparator 34.

As described above, the binarizing circuit 11f of the present embodiment is provided with the offset generation section 35 which figures out the difference between a slice level G which has previously been obtained and a demodulated signal I which is supplied to the section 35, thereby generates an offset as a direct current level and outputs the same.

In contrast, as illustrated in FIG. 1, with respect to a demodulated signal I, the binarizing circuit 11 obtains a level, which is equivalent to the foregoing offset, using a generated signal K generated from a feedback output M which has previously been generated, and then inverses this offset and outputs the inverted offset as a feedback output M.

Thus, the comparison between these two circuits shows that the feedback output M is an inversion of the slice level G.

For this reason, the binarizing circuit 11f can produce effects similar to those by the binarizing circuit 11.

However, it is noted that the binarizing circuit 11 is allowed to include members such as an output restraint circuit 23, as described in the foregoing embodiments.

As described above, the binarizing circuit in accordance with the present invention, outputting an output signal generated by binarizing an input signal which has been inputted to the binarizing circuit and oscillates around a predetermined direct current level, comprises: a comparator which compares a generated signal generated from the input signal with a predetermined level voltage, so as to output the output signal; a feedback circuit which detects the direct current level of the generated signal, so as to output, as a feedback output, a signal which is an inversion of the direct current level; and an adder which outputs the generated signal obtained by adding the feedback output to the input signal.

According to this arrangement, to the input signal oscillating around the direct current level, the feedback output which is an inversion of the direct current level is added. Therefore, the direct current level is cancelled so that the generated signal to be obtained oscillates around 0. On this account, it is possible to properly carry out the binarization with reference to a level which is the center of the oscillation, using the comparator.

As described above, the binarizing circuit with the foregoing arrangement may comprise: a comparator which compares a generated signal generated from the input signal with a predetermined level voltage, so as to output the output signal; a feedback circuit which detects the direct current level of the generated signal, so as to output, as a feedback output, a signal which is an inversion of the direct current level; and an adder which outputs the generated signal obtained by adding the feedback output to the input signal.

Hereinafter, the output from the offset canceller circuit is termed an offset canceller output. This offset canceller output is equivalent to an amount of an inversion of a slice level in the foregoing arrangement in which the binarization is carried out using a conventional slice level. The generated signal which is the sum of the offset canceller output and the input signal is equivalent to a signal indicating the difference between the input signal and the slice level.

The integration circuit performs integration on an input signal so as to output the same. In this case, what is done by the integration circuit is to dampen the temporal variation of the input signal and then outputs the signal. Thus, it is possible to adopt a low-pass filter instead of the integration circuit. The low-pass filter removes a frequency component not less than a predetermined frequency from the input signal, thereby outputting a frequency component less than the predetermined frequency.

The above-mentioned binarizing circuit operates as below. For conveniences' sake, the operations will be described according to each case of the generated signal.

First, a case when an input value of the generated signal to be inputted is more than the maximum limit value is described.

In this case, as an offset canceller output, a negative value which is an inversion of the difference between the input value and the maximum limit value is outputted. The offset canceller output is subjected to integration in the integration circuit, and then outputted as a feedback output. Subsequently, the feedback output is added to the input signal so that the generated signal is generated. Thus, since the negative offset canceller output is subjected to integration in the integration circuit and then added to the input signal, a value of the generated signal decreases.

For this reason, consequently a value of the generated signal comes close to the maximum limit value.

That is, describing the above using, for instance, a slice level in a conventional arrangement, the decrease of the generated signal which is the difference between the input signal and the slice level is equivalent to the increase of the slice level for the purpose of following the input value which is more than the maximum limit value.

Thus, even if the direct current level of the input signal steeply varies, the binarizing circuit causes the generated signal to properly follow the variation so as to carry out the binarization correctly.

The same holds true for the case when the input signal of the generated signal is smaller than the minimum limit value.

In this case, a positive value, which is an inversion of the difference between the input value and the minimum limit value, is outputted as an offset canceller output. Thus, the value of the generated signal increases so as to come close to the minimum limit value.

With this arrangement, as is the above, even if the direct current level of the input signal steeply varies, the binarizing circuit causes the generated signal to properly follow the variation so as to carry out the binarization correctly.

In the meantime, when the input value of the generated signal is within a threshold range between the maximum limit value and the minimum limit value, 0 is outputted as an offset canceller output.

This offset canceller output is subjected to integration in the integration circuit, and then added to the input signal. Since the offset canceller output is 0, the feedback output from the integration circuit is not varied.

Thus, in this case, the amount of the variation of the generated signal is equal to the amount of the variation of the input signal. In other words, for instance, the generated signal does not vary when the input signal does not vary.

With this arrangement, even if the input signal is kept at a substantially consistent level for a predetermined period of time, the generated signal varies just as much as the variation of the input signal, and hence the generated signal does not unnecessarily follow the level of the input signal.

Thus, even when the input signal is kept at a substantially consistent level, it is possible to obtain a stable output, and hence the input signal is demodulated while a bit error rate (BER) is kept low.

Note that, the maximum limit value and the minimum limit value which determine the predetermined threshold range may be determined in advance in accordance with the characteristics of the input signal, or may be varied in accordance with the characteristics of the input signal, as described below.

With the arrangement above, it is possible to provide a binarizing circuit which can carry out precise binarization even if the level of the input signal is kept substantially consistent for a long period of time.

As described above, the binarizing circuit in accordance with the present invention may be arranged in such a manner that the offset canceller circuit includes: a comparator circuit which compares either the input value with the maximum limit value or the input value with the minimum limit value, and carries out selective outputting in accordance with a result of comparison; a plurality of computing circuits each figuring out either a difference between the maximum limit value and the input value or a difference between the minimum limit value and the input value, thereby outputting the difference; and a switching circuit which selects either one of the differences figured out in the plurality of computing circuits, in accordance with the selective outputting, so as to output the selected difference as the output value.

In this arrangement, the offset canceller circuit of the binarizing circuit operates in a following manner.

The input value of the generated signal is supplied to the comparator circuit and the computing circuits.

The comparator circuit compares either the input value with the maximum limit value or the input value with the minimum limit value, and a selected output in accordance with the result of the comparison is supplied to the switching circuit. The value of the selected output is arbitrarily determined on condition that the results of the comparisons can be distinguished from each other.

Each of the computing circuits figures out either the difference between the maximum limit value and the input value or the difference between the minimum limit value and the input value, thereby outputting the difference to the switching circuit.

In accordance with the selective output from the comparator circuit, the switching circuit selects one of the differences supplied from the computing circuits, thereby outputting the selected difference as the offset canceller circuit.

With this arrangement, it is possible to realize the binarizing circuit of the present invention in a simple manner.

As described above, the binarizing circuit with the foregoing arrangement may further comprises a limit value varying circuit for varying the maximum limit value and the minimum limit value of the offset canceller circuit.

With this arrangement, it is possible to realize a precise binarizing circuit which properly binarizes an input signal, by properly varying the maximum limit value and the minimum limit value of the offset canceller circuit.

In this binarizing circuit in accordance with the present invention, when the input value is, for instance, either more than the maximum limit value or less than the minimum limit value, even if the direct current level of the input signal steeply varies, the generated signal properly follows the variation so that the binarization is correctly done.

When the input value is within the threshold range between the maximum limit value and the minimum limit value, even if the input signal is kept at a substantially consistent level, the generated signal does not follow noises generated in the consistent level so that the binarization is correctly done.

Thus, it is possible to obtain the foregoing effects by properly varying the maximum limit value and the minimum limit value in accordance with a value such as the input value of the generated signal, the value of the input signal according to the input value, etc.

For instance, the limit value varying circuit may be arranged in such a manner that, immediately after the start to input the input signal, the maximum limit value and the minimum limit value are varied in order to cause the input value to be either more than the maximum limit value or less than the minimum limit value.

According to this arrangement, immediately after the start to input the input signal, it is possible to cause the generated signal to quickly follow the input signal.

Further, for instance, the limit value varying circuit may be arranged in such a manner that after a predetermined period of time has passed from the start to input the input signal, the maximum limit value and the minimum limit value are varied so as to cause the input value to be within the threshold range between the maximum limit value and the minimum limit value.

According to this arrangement, even if the input signal is kept at a substantially consistent level after a predetermined period of time has passed from the start to input the input signal, the generated signal does not follow the input signal so that a stable output can be obtained.

As described above, the binarizing circuit with the foregoing arrangement may further comprises a time constant varying circuit for varying a time constant of the integration circuit.

Here, the integration circuit is provided for dampening the temporal variation of the input signal and then outputs the signal, that is, for instance, a frequency component not less than a frequency corresponding to a predetermined time constant is removed from the input signal, and only a frequency component less than the frequency is outputted.

In this arrangement, it is possible to realize a precise binarizing circuit which enables the generated signal to properly follow the input signal, by properly varying the time constant of the integration circuit using the time constant varying circuit.

For instance, the time constant varying circuit may be arranged in such a manner that, immediately after the start to input the input signal, the time constant is caused to be smaller than a time scale concerning the variation of the input signal.

According to this arrangement, immediately after the start to input the input signal, it is possible to cause the generated value to promptly follow the input signal.

Further, for instance, the time constant varying circuit may be arranged in such a manner that, after a predetermined period of time has passed from the start to input the input signal, the time constant is caused to be more than the foregoing time scale.

According to this arrangement, even if the input signal is kept at a substantially consistent level, the generated signal does not follow the input signal so that it is possible to obtain a stable output.

As described above, the binarizing circuit with the foregoing arrangement further comprises: an output restraint circuit which outputs a restrained output value, in accordance with a generated value which is the generated signal, a restraining degree for restraining an output, and a maximum restraining value and a minimum restraining value which determine a predetermined restraining range, the restrained output value being any one of: the generated value when the generated value is within the restraining range; a first value figured out by multiplying a difference between the generated value and the maximum restraining value by the restraining degree and then adding the maximum restraining value, when the generated value is more than the maximum restraining value; and a second value figured out by multiplying a difference between the generated value and the minimum restraining value by the restraining degree and then adding the minimum restraining value, when the generated value is less than the minimum restraining value, the restrained output value being supplied to the comparator and the feedback circuit.

Here, the restraining degree is determined to be, for instance, not less than 0 and less than 1.

In the foregoing arrangement, when the generated value which is supplied from the adder, the output restraint circuit operates in accordance with the restraining degree, the maximum restraining value, and the minimum restraining value, in the following manner.

When the generated value is within the restraining range between the maximum restraining value and the minimum restraining value, the generated value is supplied to the comparator and the feedback circuit.

When the generated value is more than the maximum restraining value, a value, which is figured out by multiplying the difference between the generated value and the maximum restraining value by the restraining degree and then adding the maximum restraining value thereto, is supplied to the comparator and the feedback circuit.

When the generated value is less than the minimum restraining value, a value, which is figured out by multiplying the difference between the generated value and the minimum restraining value by the restraining degree and then adding the minimum restraining value thereto, is supplied to the comparator and the feedback circuit.

Thus, when the amplitude of the generated value which has been supplied is large, it is possible to decrease the amplitude.

On this account, it is possible to reduce errors and hence precisely carry out the binarization, by properly decreasing the amplitude of the generated signal in accordance with the characteristics of the signal, thereby outputting the same.

That is to say, for instance, the input signal occasionally has an unnecessarily high amplitude. This is such a case that when the binarizing circuit is provided in a wireless communication device, the input signal has an unnecessarily high amplitude because of the characteristics of a filter for obtaining a demodulated signal, the characteristics of a filter for restraining a transmitting spurious output provided on the side of the sender, etc. In this case, if binarization is simply carried out in accordance with the high amplitude, errors could occur.

Thus, using the foregoing output restraint circuit, the amplitude is decreased when the same is unnecessarily large, so that the binarization can be certainly and properly carried out.

As described above, the binarizing circuit with the foregoing arrangement may be arranged in such a manner that the output restraint circuit includes: a comparator circuit which outputs a value according to a comparison either between the generated value and the maximum restraining value or between the generated value and the minimum restraining value; a plurality of computing circuits each outputs a setting value equivalent to either the first value or the second value; and a switching circuit which selects either the first value or the second value figured out in the plurality of computing circuits, in accordance with the value according to the comparison, so as to output the selected value as the restrained output value.

In this arrangement, the output restraint circuit of the binarizing circuit operates in the following manner.

The generated value, which is the generated signal supplied from the adder, is supplied to the comparator circuit and the computing circuits.

The comparator circuit compares either the generated value with the maximum restraining value or the generated value with the minimum restraining value, and supplies an output according to the results of the comparisons to the switching circuit. The value of the output is arbitrarily determined on condition that the results of the comparisons can be distinguished from each other.

Each of the computing circuits outputs, as a setting value, either: a value figured out by multiplying the difference between the generated value and the maximum restraining value by the restraining degree and then adding the maximum restraining value thereto; or a value figured out by multiplying the difference between the generated value and the minimum restraining value and then adding the minimum restraining value thereto, to the switching circuit.

The switching circuit selects one of the setting values supplied from the computing circuits, in accordance with the output from the comparator circuit, and then outputs the selected setting value as the foregoing restraining output value.

Thus, the above makes it possible to realize the binarizing circuit in accordance with the present invention, using a simple arrangement.

As described above, the binarizing circuit with the foregoing arrangement may further comprises a restraining value varying circuit for varying the maximum restraining value and the minimum restraining value of the output restraint circuit.

According to this arrangement, properly varying the maximum restraining value and the minimum restraining value using the restraint value varying circuit enables to realize a precise binarizing circuit which causes the generated signal to properly follow the input signal.

That is, it is possible to certainly obtain the foregoing effects by properly varying the maximum restraining value and the minimum restraining value in accordance with the generated value which is the generated signal, the input signal corresponding to the generated value, etc.

For instance, the restraining value varying circuit may be arranged in such a manner that, immediately after the start to input the input signal, the maximum restraining value and the minimum restraining value are varied to cause the generated value to be either more than the maximum restraining value or less than the minimum restraining value.

According to this arrangement, immediately after the start to input the input signal, respective absolute values of the maximum restraining value and the minimum restraining value are caused to be small so that the generated signal can promptly follow the input signal.

Alternatively, for instance, the restraining value varying circuit may be arranged in such a manner that, after a predetermined period of time has passed from the start to input the input signal, the maximum restraining value and the minimum restraining value are varied to cause the generated value to be within the restraining range between the maximum restraining value and the minimum restraining value.

According to this arrangement, after a predetermined period of time has passed from the start to input the input signal, respective absolute values of the maximum restraining value and the minimum restraining value are caused to be large so that the generated value does not follow the input signal even if the input signal is kept at a substantially consistent level, and hence a stable output can be obtained.

As described above, the binarizing circuit may further comprises a restraining degree varying circuit for varying the restraining degree of the output restraint circuit.

According to this arrangement, by properly varying the maximum restraining value and the minimum restraining value of the output restraint circuit, using the restraining value varying circuit, it is possible to realize a precise binarizing circuit which causes the generated signal to properly follow the input signal.

That is to say, it is possible to certainly obtain the foregoing effects by properly varying the restraining degree in accordance with the generated value which is the generated signal, the input signal corresponding to the generated value, etc.

For instance, the restraining degree varying circuit may be arranged in such a manner that, immediately after the start to input the input signal, the restraining degree is varied to be small.

According to this arrangement, immediately after the start to input the input signal, the restraining degree is caused to be small so that the generated signal is caused to promptly follow the input signal.

Alternatively, for instance, the restraining degree varying circuit may be arranged in such a manner that, after a predetermined period of time has passed from the start to input the input signal, the restraining degree is varied to be large.

According to this arrangement, after a predetermined period of time has passed from the start to input the input signal, the generated signal does not follow the input signal even if the input signal is kept at a substantially consistent level, and hence a stable output can be obtained.

As described above, the binarizing circuit with the foregoing arrangement may further comprises: an output hold circuit which outputs a cutoff output value in accordance with a generated value which is the generated signal and a maximum cutoff value and a minimum cutoff value which determine a predetermined cutoff range, the cutoff output value being any one of: the generated value when the generated value is within the cutoff range; the maximum cutoff value when the generated value is more than the minimum cutoff value; and the minimum cutoff value when the generated value is less than the minimum cutoff value, the cutoff output value being supplied to the comparator and the feedback circuit.

According to this arrangement, when the generated value which is the generated signal is supplied from the adder, the output hold circuit operates in accordance with the maximum cutoff value and the minimum cutoff value, in the following manner.

When the generated value is within the cutoff range between the maximum cutoff value and the minimum cutoff value, the generated value is supplied to the comparator and the feedback circuit.

When the generated value is more than the maximum cutoff value, the maximum cutoff value is supplied to the comparator and the feedback circuit.

When the generated value is less than the minimum cutoff value, the minimum cutoff value is supplied to the comparator and the feedback circuit.

That is to say, the binarizing circuit with the output hold circuit is equivalent to the foregoing binarizing circuit with the output restraint circuit, when the restraining degree=0, the maximum restraining value=the maximum cutoff value, and the minimum restraining value=minimum cutoff value.

Thus, even if the amplitude of the generated value is large, it is possible to cause the same to be certainly within the cutoff range, thereby reducing the amplitude.

On this account, as in the foregoing arrangement, it is possible to reduce errors and hence precisely carry out the binarization, by properly decreasing the amplitude of the generated signal in accordance with the characteristics of the signal, thereby outputting the same.

As described above, the binarizing circuit with the foregoing arrangement may be arranged in such a manner that, the output hold circuit includes: a comparator circuit which outputs a value according to a comparison either between the generated value and the maximum cutoff value or between the generated value and the minimum cutoff value; a plurality of computing circuits each figuring out either a difference between the generated value and the maximum cutoff value or a difference between the generated value and the minimum cutoff value, thereby outputting the difference; and a switching circuit which selects either one of the differences figured out in the plurality of computing circuits, in accordance with the value according to the comparison, so as to output the selected difference as the cutoff output value.

According to this arrangement, the output hold circuit of the binarizing circuit operates in the following manner.

The generated value, which is the generated signal supplied from the adder, is supplied to the comparator circuit and the computing circuits.

The comparator circuit compares either the generated value with the maximum cutoff value or the generated value with the minimum cutoff value, and supplies an output according to the results of the comparisons to the switching circuit. The value of the output is arbitrarily determined on condition that the results of the comparisons can be distinguished from each other.

Each of the computing circuits supplies, as a setting value, either the maximum cutoff value or the minimum cutoff value to the switching circuit.

According to the output from the comparator circuit, the switching circuit selects one of the setting values form the computing circuits, thereby outputting the selected value as the cutoff output value.

With this arrangement, it is possible to realize the binarizing circuit in accordance with the present invention in a simple manner.

As described above, the binarizing circuit with the foregoing arrangement may further comprises a cutoff value varying circuit for varying the maximum cutoff value and the minimum cutoff value of the output hold circuit.

According to this arrangement, properly varying the maximum cutoff value and the minimum cutoff value using the cutoff value varying circuit enables to realize a precise binarizing circuit which causes the generated signal to properly follow the input signal.

That is to say, it is possible to certainly obtain the foregoing effects by properly varying the maximum cutoff value and the minimum cutoff value in accordance with the generated value which is the generated signal, the input signal corresponding to the generated value, etc.

For instance, the cutoff value varying circuit may be arranged in such a manner that, immediately after the start to input the input signal, the maximum cutoff value and the minimum cutoff value are varied to cause the generated value to be either more than the maximum cutoff value or less than the minimum cutoff value.

With this arrangement, immediately after the start to input the input signal, respective absolute values of the maximum cutoff value and the minimum cutoff value are caused to be small so that it is possible to cause the generated signal to promptly follow the input signal.

Alternatively, for instance, the cutoff value varying circuit may be arranged in such a manner that, after a predetermined period of time has passed from the start to input the input signal, the maximum cutoff value and the minimum cutoff value are varied to cause the generated value to be within the cutoff range between the maximum cutoff value and the minimum cutoff value.

According to this arrangement, after a predetermined period of time has passed from the start to input the input signal, respective absolute values of the maximum cutoff value and the minimum cutoff value are caused to be large, so that the generated signal does not follow the input signal even if the input signal is kept at a substantially consistent level, and hence a stable output can be obtained.

As described above, the binarizing circuit in accordance with the present invention comprises: a low-pass filter which detects a predetermined direct current level around which an input signal oscillates, so as to output the detected direct current level; a comparator which outputs an output signal obtained by comparing the input signal with the direct current level; and an offset generation section which outputs an output value in accordance with a difference of levels between the output signal and the direct current level and a maximum limit value and a minimum limit value which determine a predetermined threshold range, the output value being any one of: 0 when the difference of the levels is within the threshold range; a difference between the difference of the levels and the maximum limit value, when the difference of the levels is more than the maximum limit value; and a difference between the difference of the levels and the minimum limit value, when the difference of the levels is less than the minimum limit value, the low-pass filter outputting the direct current level to the comparator and the offset generation section.

In this binarizing circuit, the difference of the levels is caused to decrease so that the output from the offset generation section is varied in order to follow the variation of the input signal. Thus, even if, for instance, the direct current level of the input signal steeply varies, the generated signal can properly follow the variation and hence the binarization is properly carried out.

As described above, the wireless communication device in accordance with the present invention comprises any one of the foregoing binarizing circuits.

Here, the binarizing circuit provided in the wireless communication device can precisely carry out binarization even when an input signal is substantially kept at a consistent level for a long period of time. Thus, adopting the binarizing circuit, the wireless communication device can precisely carry out binarization even if the level of the input signal is kept substantially consistent, and thus can realize stable wireless communication.

As described above, the wireless communication device with the foregoing arrangement may be arranged such that wireless communication is carried out using a spread spectrum method.

According to this arrangement, it is possible to realize the wireless communication device which carries out stable wireless communication when adopting the spread spectrum method.

As described above, the binarizing method in accordance with the present invention, for outputting an output signal generated by binarizing an input signal oscillating around a predetermined direct current level, comprises the steps of: (a) detecting the direct current level using a generated signal generated from the input signal, then outputting, as a feedback output, a signal equivalent to an inversion of the direct current level; (b) outputting a sum of the input signal and the feedback output, as the generated signal; and (c) outputting the output signal obtained by comparing the generated signal with a predetermined level voltage.

According to this arrangement, the binarization is carried out by the operation identical with that of the foregoing binarizing circuit, with reference to the level which is the center of the oscillation. Thus, it is possible to properly carry out the binarization.

Further, if a proper feedback output is obtained by, for instance, arrangement as below, it is possible to precisely carry out the binarization even if the level of the input signal is substantially consistent for a long period of time.

As described above, the binarizing method with the foregoing arrangement may be arranged in such a manner that, the step (a) includes the sub-steps of: producing an output value in accordance with an input value of the generated signal and a maximum limit value and a minimum limit value which determine a predetermined threshold range, the output value being any one of: 0 when the input value is within the threshold range; an inversion of a difference between the input value and the maximum limit value, when the input value is more than the maximum limit value; and an inversion of a difference between the input value and the minimum limit value, when the input value is less than the minimum limit value; and detecting a signal which is produced by inverting the direct current level by use of the output value, then outputting the signal.

According to this arrangement, it is possible to obtain the effects similar to those by the foregoing binarizing circuits, by use of the operation similar to that of those binarizing circuits.

That is to say, 0 is outputted when the input value of the generated signal is within the threshold range between the maximum limit value and the minimum limit value, and this output is used for the detection and outputting. For this reason, the feedback output is not varied.

Thus, in this case, the generated signal does not vary when the input signal does not vary, and hence the generated signal does not unnecessarily follow the level of the input signal even if the level of the input signal is substantially kept consistent for a predetermined period of time. In this account, it is possible to obtain a stable output even if the input signal is kept at a substantially consistent level.

As described above, the binarizing method in accordance with the present invention, for detecting a predetermined first direct current level around which an input signal oscillates, then outputting an output signal obtained by comparing the input signal with the first direct current level, comprises the steps of: measuring a first difference between the first direct current level and a level of the input signal; outputting an output value in accordance with a second difference between the input signal and a second direct current level which has previously been detected and a maximum limit value and a minimum limit value which determine a predetermined threshold range, the output value being any one of: 0 when the second difference falls within the threshold range; a difference between the second difference and the maximum limit value, when the second difference is more than the maximum limit value; and a difference between the second difference and the minimum limit value, when the second difference is less than the minimum limit value; and detecting the first direct current level by use of the output value.

According to this arrangement, it is possible to obtain the effects similar to those by the foregoing binarizing circuits, by use of the operation similar to that of those binarizing circuits.

That is to say, when the difference of the levels between the input signal and the direct current level is within the threshold range between the maximum limit value and the minimum limit value, 0 is outputted and this output is used for detecting the direct current level. For this reason, even if the input signal is kept at a substantially consistent level, the direct current level is not varied so that a stable output can be obtained.

As described above, the binarizing method in accordance with the present invention, for carrying out binarization in accordance with a difference, comprises the steps of: (A) generating an offset by converting a difference between an input signal and a third direct current level which has been detected from a previous input signal, then outputting the offset; and (B) detecting a fourth direct current level of the input signal, from the offset.

According to this arrangement, the binarizing method is arranged so that the difference between the input signal and the third direct current level is converted so as to be outputted as an offset, then the fourth direct current level of the input signal is detected from the offset, so that the binarization is carried out in accordance with the difference between the input signal and the direct current level. By repeating these steps, the output signal is binarized and then outputted.

It is noted that the step (B) may be a step of detecting an inversion of the direct current level of the fourth input signal from an inversion of the offset.

With this arrangement, if the difference between the input signal and the third direct current level is properly converted so as to be outputted as an offset, it is possible to precisely carry out the binarization without varying the direct current level detected from the offset, even when the input signal is kept at a substantially consistent level for a long period of time.

Note that, according to conventional arrangements, binarization has been carried out using, for instance, the difference between a present input signal and a present direct current level figured out from this input signal. Alternatively, for instance, binarization has been carried out using the difference between a present input signal and a present direct current level which is figured out from the present input signal and a previous direct current level. In this manner, the conventional arrangements do not include the step of converting the difference and then outputting the same as an offset. Further, the conventional arrangements do not include the step of detecting the direct current level of an input signal from an offset.

Moreover, according to the conventional arrangements, binarization has been carried out by varying a threshold value. In contrast, according to the present invention, for instance, binarization is carried out in such a manner that a threshold value is fixed to 0 and a signal is converted by subjecting the signal to a feedback.

Moreover, the binarizing method in accordance with the present invention may further comprises the step of binarizing a difference between the fourth direct current level and a next input signal.

That is to say, such as the binarizing circuit 11 in FIG. 1, there is such a possible arrangement that, a feedback output M, which is detected in the step (B) and equivalent to an inverted direct current level, is added to the input signal I so that a generated signal K as the difference is obtained, and this generated signal K is binarized by a comparator 13. In this example, the step (B) is equivalent to a step of detecting an inversion of the direct current level of the input signal, from an inversion of the offset.

Moreover, the binarizing method in accordance with the present invention may further comprises the step of binarizing a difference between the fourth direct current level and the input signal.

That is to say, such as the binarizing circuit 11$f$ in FIG. 9, there is such a possible arrangement that, a slice level G as a direct current level detected in the step of detecting the level is obtained from an output outputted from an offset generation section 35 as an offset, the output being obtained from a demodulated signal I as an input signal and outputted in the step of outputting the offset. Then the difference between the slice level G and the demodulated signal I may be binarized by a comparator 34.

Moreover, the binarizing method in accordance with the present invention may be arranged in such a manner that, in the step (A), the offset is converted in a manner suitable for a decision whether or not the difference in the step (A) is within a predetermined threshold range, so that the offset is outputted.

In this manner, if the conversion for obtaining the offset from the difference is properly arranged to be suitable for the decision whether or not the difference is within the predetermined threshold range, it is possible to certainly and precisely carry out the binarization without varying the direct current level detected from the offset, even if the level of the input signal is substantially consistent for a long period of time.

Moreover, the binarizing method in accordance with the present invention may be arranged in such a manner that, in the step (B), the fourth direct current level is detected from the offset using a low-pass filter.

According to this arrangement, it is possible to realize the step (B) with ease.

It is noted that, as long as predetermined functions are realized, the members as means of the binarizing circuit of the present invention may be, for instance, realized as combinations of predetermined circuit elements or realized as functional blocks by programming predetermined programmable circuit elements.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A binarizing circuit outputting an output signal generated by binarizing an input signal which has been inputted to the binarizing circuit and oscillates around a direct current level, the binarizing circuit comprising:
    a comparator which compares a generated signal generated from the input signal with a level voltage, so as to output the output signal;
    a feedback circuit which detects a direct current level of the generated signal, so as to output, as a feedback output, a signal which is an inversion of the direct current level of the generated signal; and
    an adder which outputs the generated signal obtained by adding the feedback output to the input signal.

2. The binarizing circuit as defined in claim 1, wherein, the feedback circuit includes:
    an offset canceller circuit which produces an output value in accordance with an input value of the generated signal and a maximum limit value and a minimum limit value which determine a threshold range, the output value being any one of: 0 when the input value is within the threshold range; a value equivalent to an inversion of a difference between the input value and the maximum limit value, when the input value is more than the maximum limit value; and a value equivalent to an inversion of a difference between the input value and the minimum limit value, when the input value is less than the minimum limit value; and
    an integration circuit which performs integration on the output value, so as to output, as the feedback output, a value resulting from the integration.

3. The binarizing circuit as defined in claim 2, wherein, the offset canceller circuit includes:
    a comparator circuit which compares either the input value with the maximum limit value or the input value with the minimum limit value, and carries out selective outputting in accordance with a result of comparison;
    a plurality of computing circuits each computing either a difference between the maximum limit value and the input value or a difference between the minimum limit value and the input value, thereby outputting the difference; and
    a switching circuit which selects either one of the differences figured out in the plurality of computing circuits, in accordance with the selective outputting, so as to output the selected difference as the output value.

4. The binarizing circuit as defined in claim 2, further comprising a limit value varying circuit for varying the maximum limit value and the minimum limit value of the offset canceller circuit.

5. The binarizing circuit as defined in claim 2, further comprising a time constant varying circuit for varying a time constant of the integration circuit.

6. The binarizing circuit as defined in claim 1, further comprising:
    an output restraint circuit which outputs a restrained output value, in accordance with a generated value which is the generated signal supplied from the adder, a restraining degree for restraining an output, and a maximum restraining value and a minimum restraining value which determine a restraining range, the restrained output value being any one of: the generated value when the generated value is within the restraining range; a first value computed by multiplying a difference between the generated value and the maximum restraining value by the restraining degree and then adding the maximum restraining value, when the generated value is more than the maximum restraining value; and a second value computed by multiplying a difference between the generated value and the minimum restraining value by the restraining degree and then adding the minimum restraining value, when the generated value is less than the minimum restraining value,
    the restrained output value being supplied to the comparator and the feedback circuit.

7. The binarizing circuit as defined in claim 6, wherein, the output restraint circuit includes:
    a comparator circuit which outputs a value according to a comparison either between the generated value and the maximum restraining value or between the generated value and the minimum restraining value;
    a plurality of computing circuits each of which outputs a setting value equivalent to either the first value or the second value; and
    a switching circuit which selects either the first value or the second value computed in the plurality of computing circuits, in accordance with the value according to the comparison, so as to output the selected value as the restrained output value.

8. The binarizing circuit as defined in claim 6, further comprising a restraining value varying circuit for varying the maximum restraining value and the minimum restraining value of the output restraint circuit.

9. The binarizing circuit as defined in claim 6, further comprising a restraining degree varying circuit for varying the restraining degree of the output restraint circuit.

10. The binarizing circuit as defined in claim 1, further comprising:
    an output hold circuit which outputs a cutoff output value in accordance with a generated value which is the generated signal and a maximum cutoff value and a minimum cutoff value which determine a cutoff range, the cutoff output value being any one of: the generated value when the generated value is within the cutoff range; the maximum cutoff value when the generated value is more than the minimum cutoff value; and the minimum cutoff value when the generated value is less than the minimum cutoff value,
    the cutoff output value being supplied to the comparator and the feedback circuit.

11. The binarizing circuit as defined in claim 10, wherein, the output hold circuit includes:
a comparator circuit which outputs a value according to a comparison either between the generated value and the maximum cutoff value or between the generated value and the minimum cutoff value;
a plurality of computing circuits each computing either a difference between the generated value and the maximum cutoff value or a difference between the generated value and the minimum cutoff value, thereby outputting the difference; and
a switching circuit which selects either one of the differences computed in the plurality of computing circuits, in accordance with the value according to the comparison, so as to output the selected difference as the cutoff output value.

12. The binarizing circuit as defined in claim 10, further comprising a cutoff value varying circuit for varying the maximum cutoff value and the minimum cutoff value of the output hold circuit.

13. A binarizing circuit, comprising:
a low-pass filter which detects a direct current level around which an input signal oscillates, so as to output the detected direct current level;
a comparator which outputs an output signal obtained by comparing the input signal with the direct current level; and
an offset generation section which outputs an output value in accordance with a difference of levels between the output signal and the direct current level and a maximum limit value and a minimum limit value which determine a threshold range, the output value being any one of: 0 when the difference of the levels is within the threshold range; a difference between the difference of the levels and the maximum limit value, when the difference of the levels is more than the maximum limit value; and a difference between the difference of the levels and the minimum limit value, when the difference of the levels is less than the minimum limit value,
the low-pass filter outputting the direct current level to the comparator and the offset generation section.

14. A wireless communication device, comprising a binarizing circuit which outputs an output signal generated by binarizing an input signal oscillating around a direct current level,
the binarizing circuit comprising:
a comparator which compares a generated signal generated from the input signal with a predetermined level voltage, so as to output the output signal;
a feedback circuit which detects a direct current level of the generated signal, so as to output, as a feedback output, a signal which is an inversion of the direct current level of the generated signal; and
an adder which outputs the generated signal obtained by adding the feedback output to the input signal.

15. The wireless communication device as defined in claim 14, wherein, wireless communication is carried out using a spread spectrum method.

16. A wireless communication device, comprising a binarizing circuit which includes:
a low-pass filter which detects a direct current level around which an input signal oscillates, so as to output the detected direct current level;
a comparator which outputs an output signal obtained by comparing the input signal with the direct current level; and
an offset generation section which outputs an output value in accordance with a difference of levels between the input signal and the direct current level and a maximum limit value and a minimum limit value which determine a threshold range, the output value being any one of: 0 when the difference of the levels is within the threshold range; a difference between the difference of the levels and the maximum limit value, when the difference of the levels is more than the maximum limit value; and a difference between the difference of the levels and the minimum limit value, when the difference of the levels is less than the minimum limit value,
the low-pass filter outputting the direct current level to the comparator and the offset generation section.

17. The wireless communication device as defined in claim 16, wherein, wireless communication is carried out using a spread spectrum method.

18. A binarizing method for outputting an output signal generated by binarizing an input signal oscillating around a direct current level, comprising the steps of:
(a) detecting the direct current level using a generated signal generated from the input signal, then outputting, as a feedback output, a signal equivalent to an inversion of the direct current level;
(b) outputting a sum of the input signal and the feedback output, as the generated signal; and
(c) outputting the output signal obtained by comparing the generated signal with a level voltage.

19. The binarizing method as defined in claim 18, wherein, the step (a) includes the sub-steps of:
producing an output value in accordance with an input value of the generated signal and a maximum limit value and a minimum limit value which determine a threshold range, the output value being any one of: 0 when the input value is within the threshold range; an inversion of a difference between the input value and the maximum limit value, when the input value is more than the maximum limit value; and an inversion of a difference between the input value and the minimum limit value, when the input value is less than the minimum limit value; and
detecting a signal which is produced by inverting the direct current level by use of the output value, then outputting the signal.

20. A binarizing method for detecting a first direct current level around which an input signal oscillates, then outputting an output signal obtained by comparing the input signal with the first direct current level, comprising the steps of:
measuring a first difference between the first direct current level and a level of the input signal;
outputting an output value in accordance with a second difference between the input signal and a second direct current level which has previously been detected and a maximum limit value and a minimum limit value which determine a threshold range, the output value being any one of: 0 when the second difference falls within the threshold range; a difference between the second difference and the maximum limit value, when the second difference is more than the maximum limit value; and a difference between the second difference and the minimum limit value, when the second difference is less than the minimum limit value; and
detecting the first direct current level by use of the output value.

21. A binarizing method for carrying out binarization in accordance with a difference, comprising the steps of:
  (A) generating an offset by converting a difference between an input signal and a first direct current level which has been detected from a previous input signal, then outputting the offset; and
  (B) detecting a second direct current level of the input signal, from the offset.

22. The binarizing method as defined in claim 21, further comprising the step of binarizing a difference between the second direct current level and a next input signal.

23. The binarizing method as defined in claim 21, further comprising the step of binarizing a difference between the second direct current level and the input signal.

24. The binarizing method as defined in claim 21, wherein, in the step (A), the offset is converted in a manner suitable for a decision whether or not the difference in the step (A) is within a threshold range, so that the offset is outputted.

25. The binarizing method as defined in claim 21, wherein, in the step (A), 0 is outputted as the offset when the difference in the step (A) is within a threshold range.

26. The binarizing method as defined in claim 21, wherein, in the step (B), the second direct current level is detected from the offset using a low-pass filter.

27. A binarizing circuit outputting an output signal generated by binarizing an input signal, the binarizing circuit comprising:
  an adder for outputting a generated signal;
  a comparator for comparing the generated signal to a reference voltage to generate the output signal; and
  a feedback circuit for detecting the generated signal and producing a feedback signal based on the detecting, the feedback signal being added by the adder to the input signal to provide the generated signal,
  wherein the feedback circuit is configured to produce the feedback signal so that the generated signal follows changes in the input signal when the changes are outside a threshold range and so that the generated signal does not follow the changes in the input signal when the changes are within the threshold range.

28. A wireless communication device comprising a binarization circuit as defined in claim 27.

* * * * *